(12) United States Patent
Suzuki

(10) Patent No.: US 6,605,993 B2
(45) Date of Patent: Aug. 12, 2003

(54) OPERATIONAL AMPLIFIER CIRCUIT

(75) Inventor: Hisao Suzuki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/769,249

(22) Filed: Jan. 26, 2001

(65) Prior Publication Data

US 2001/0052818 A1 Dec. 20, 2001

(30) Foreign Application Priority Data

| May 16, 2000 | (JP) | 2000-142960 |
| Jul. 31, 2000 | (JP) | 2000-230497 |
| Jul. 31, 2000 | (JP) | 2000-230498 |
| Jul. 31, 2000 | (JP) | 2000-230995 |

(51) Int. Cl.$^7$ ............................................. H03F 3/45
(52) U.S. Cl. ........................ 330/252; 330/253; 330/257
(58) Field of Search ................................ 330/252, 253, 330/254, 257, 261

(56) References Cited

U.S. PATENT DOCUMENTS

| 4,797,631 A | * | 1/1989 | Hsu et al. .................... 330/253 |
| 5,384,548 A | | 1/1995 | Sakurai et al. |
| 5,523,718 A | * | 6/1996 | Butler ......................... 330/261 |
| 5,610,557 A | * | 3/1997 | Jett, Jr. ........................ 330/261 |
| 5,631,607 A | * | 5/1997 | Huijsing et al. ............. 330/253 |
| 5,714,906 A | * | 2/1998 | Motamed et al. ............ 330/253 |
| 5,801,564 A | * | 9/1998 | Gasparik ..................... 330/257 |
| 6,124,760 A | * | 9/2000 | Hong .......................... 330/253 |
| 6,194,962 B1 | * | 2/2001 | Chen ........................... 330/253 |
| 6,194,966 B1 | * | 2/2001 | Dasgupta ..................... 330/253 |

* cited by examiner

Primary Examiner—Robert Pascal
Assistant Examiner—Khanh Van Nguyen
(74) Attorney, Agent, or Firm—Arent Fox Kintner Plotkin & Kahn

(57) ABSTRACT

An operational amplifier circuit includes a first differential pair, which includes first and second transistors, and a second differential pair, which includes third and fourth transistors. A fifth transistor is connected to the first and third transistors. A sixth transistor is connected to the second and fourth transistors. A first current source is connected to the first differential pair to provide a first bias current. A second current source is connected to the second differential pair to provide a second bias current. A third current source is connected to the fifth transistor to provide a third bias current. A fourth current source is connected to the sixth transistor provide a fourth bias current. A control circuit controls the first to fourth current sources such that the sum of the first and second bias currents is constant and the second to fourth bias currents become substantially equal.

29 Claims, 12 Drawing Sheets

OPERATIONAL AMPLIFIER CIRCUIT

BACKGROUND OF THE INVENTION

The present invention relates to an operational amplifier circuit, and, more particularly, to a rail-to-rail type operational amplifier circuit, a push-pull type operational amplifier circuit, a current output circuit and an analog switch circuit, which are used as a basic operational circuit in an electronic device.

FIG. 1 is a schematic circuit diagram of a rail-to-rail type operational amplifier circuit 10 according to first prior art.

A first input voltage VIN− is applied to the inverting input terminal (negative input terminal) 11 of the operational amplifier circuit 10, and a second input voltage VIN+ is applied to the non-inverting input terminal (positive input terminal) 12 thereof. The input terminals 11 and 12 are respectively connected to the gates of P channel MOS transistors (hereinafter referred to as "PMOS transistors") Q1 and Q2, which constitute a first differential pair 13. The sources of the transistors Q1 and Q2 are connected together and a node between the sources is connected to a high-potential power supply VD via a first current source 14, which supplies a bias current to the transistors Q1 and Q2. The input terminals 11 and 12 are also respectively connected to the gates of N channel MOS transistors (hereinafter referred to as "NMOS transistors") Q3 and Q4, which constitute a second differential pair 15. The sources of the transistors Q3 and Q4 are connected together, and a node between the sources is connected to a low-potential power supply GND via a second current source 16, which supplies a bias current to the transistors Q3 and Q4.

The drains of the transistors Q1 and Q2 are connected to the low-potential power supply GND via a pair of NMOS transistors Q5 and Q6, which constitute a first current mirror circuit 17. The gates of the transistors Q5 and Q6 are connected together and a node between the gates is connected to the drain of the transistor Q5.

The drain of the transistor Q6 is connected to the gate of an output NMOS transistor Q7. The source of the transistor Q7 is connected to the low-potential power supply GND and the drain is connected to the high-potential power supply VD via a resistor R1. The drain of the transistor Q7 is connected to an output terminal 18.

The drains of the transistors Q3 and Q4 are respectively connected to second and third current mirror circuits 19 and 20. The second current mirror circuit 19 includes a pair of PMOS transistors Q8 and Q9. The drain of the transistor Q3 is connected to the high-potential power supply VD via the transistor Q8. The source of the transistor Q9 is connected to the high-potential power supply VD and the drain of the transistor Q9 is connected to the drain of the transistor Q6.

The third current mirror circuit 20 includes a pair of PMOS transistors Q10 and Q11. The drain of the transistor Q4 is connected to the gates of the transistors Q8 and Q9 via the transistor Q10. The source of the transistor Q11 is connected to the high-potential power supply VD, and the drain of the transistor Q11 is connected to the drain of the transistor Q5.

The first and second current sources 14 and 16, which are controlled by an unillustrated control circuit, supply bias currents I1 and I2 according to the input voltages VIN+ and VIN− as shown in FIG. 2. Specifically, when the first and second input voltages VIN− and VIN+ are low, the first differential pair 13 drives the transistors Q5 and Q6, and when the input voltages VIN+ and VIN− are high, the second differential pair 15 drives the transistors Q5 and Q6.

As the first and second differential pairs 13 and 15 operate this way, the sum of the bias currents I1 and I2 of the first and second current sources 14 and 16 is constant. Even when the potential difference between the input voltages VIN+ and VIN− is zero, therefore, constant currents I5 and I6 flow in the transistors Q5 and Q6, respectively.

The currents flowing the transistors Q1 and Q2 of the first differential pair 13 are directly supplied to the transistors Q5 and Q6, and the currents flowing the transistors Q3 and Q4 of the second differential pair 15 are supplied to the transistors Q5 and Q6 via the second and third current mirror circuits 19 and 20. Accordingly, the current supplies to the transistors Q5 and Q6 from the second differential pair 13 are delayed by the operational times of the second and third current mirror circuits 19 and 20, so that the currents flowing the transistors Q5 and Q6 transiently vary.

When the potential difference between the input voltages VIN+ and VIN− is maintained at zero and the absolute value of the input voltage changes, therefore, the currents I5 and I6 transiently vary every time the enabling/disabling of the first and second current sources 14 and 16 is switched. This decreases the common mode rejection ratio (CMRR) of the operational amplifier circuit 10.

When both the first and second current sources 14 and 16 are used and the transistors Q1–Q4 of the first and second differential pairs 13 and 15 are operating, the output transistor control by the first current source 14 and the output transistor control by the second current source 16 are executed simultaneously. In this case, there is a time lag between the output transistor control by the second current source 16 and the output transistor control by the first current source 14. This reduces the frequency characteristic of the operational amplifier circuit 10.

Further, the voltages on which the PMOS transistors Q1 and Q2 and the NMOS transistors Q3 and Q4 operate vary according to the process conditions. Depending on process variation, therefore, the first or second differential pair 13 or 15 may not operate.

Suppose that the operational points of the PMOS transistors Q1 and Q2 and the NMOS transistors Q3 and Q4 lie between a reference voltage Va and the high-potential power supply VD due to a process variation as shown in FIG. 2. Then, the NMOS transistors Q3 and Q4 do not operate even when the first and second input voltages VIN− and VIN+, which change the first and second bias currents I1 and I2, are supplied.

Therefore, the NMOS transistors Q3 and Q4 do not operate even if the first and second input voltages VIN− and VIN+ rise, and the PMOS transistors Q1 and Q2 of the first differential pair 13 stop operating when the first and second bias currents I1 and I2 are switched from one to the other.

FIG. 3 is a circuit diagram of a push-pull type operational amplifier circuit 300 according to second prior art circuit.

The operational amplifier circuit 300 has a constant current source 11b which supplies a constant current Ia to a current mirror circuit 12b. The current mirror circuit 12b includes NMOS transistors Q1b, Q2b and Q3b. The constant current Ia is supplied to the drain of the transistor Q1b. The drain of the transistor Q1b is connected to the gates of the transistors Q1b, Q2b and Q3b, the sources of which are connected to a low-potential power supply VS. The drain of the transistor Q2b is connected to a current mirror circuit 13b, and the drain of the transistor Q3b is connected to a differential input circuit 14b.

The transistor Q2b has the same size as the transistor Q1b and supplies the current mirror circuit 13b with a drain current that is substantially the same as the constant current Ia of the constant current source 11b. The transistor Q3b is double the size of the transistor Q1b and supplies the differential input circuit 14b with a drain current that is double the constant current Ia of the constant current source 11b.

The current mirror circuit 13b includes PMOS transistors Q4b and Q5b. The drain of the transistor Q4b is connected to the drain of the transistor Q2b. The sources of the transistors Q4b and Q5b are connected to a high-potential power supply VD, and the gates of the transistors Q4b and Q5b are connected together to the drain of the transistor Q4b.

The transistor Q5b has double the size of the transistor Q4b and produces a drain current that is twice as large as the current flowing the transistor Q5b. As the drain current, which is substantially the same as the constant current Ia, flows in the transistor Q4b, a current that is double the constant current Ia is output from the drain of the transistor Q5b.

The differential input circuit 14b includes a pair of NMOS transistors Q6b and Q7b and a pair of PMOS transistors Q8b and Q9b. The sources of the transistors Q6b and Q7b are connected to the drain of the transistor Q3b. The drain of the transistor Q6b is connected to the drain of the transistor Q8b and the gates of the transistors Q8b and Q9b. The source of the transistor Q8b is connected to the high-potential power supply VD. The drain of the transistor Q7b is connected to the drain of the transistor Q9b, the source of which is connected to the high-potential power supply VD.

The differential input circuit 14b receives a bias current from the transistor Q3b and sets a potential at a node N1b between the transistors Q7b and Q9b in accordance with the potential difference between the voltages of input signals IM and IP, which are applied to the gates of the transistors Q6b and Q7b.

The node N1b is connected to the gate of a PMOS transistor Q10b and the gate of a PMOS transistor Q11b at the final output stage. The sources of the transistors Q10b and Q11b are connected to the high-potential power supply VD. The drain of the transistor Q11b is connected to an output terminal To. The transistor Q11b is ten times the size of the transistor Q10b and produces a drain current that is ten times the drain current of the transistor Q10b.

The drain of the transistor Q10b is connected to a current mirror circuit 15b. The current mirror circuit 15b includes NMOS transistors Q12b and Q13b. The drain of the transistor Q12b is connected to the drain of the transistor Q10b. The sources of the transistors Q12b and Q13b are connected to the low-potential power supply VS, and the drain of the transistor Q12b is connected to the gates of the transistors Q12b and Q13b.

The transistor Q13b has substantially the same size as the transistor Q12b and produces the drain current of the transistor Q12b (i.e., the drain current of the transistor Q12b is substantially the same as the drain current of the transistor Q10b).

The drain of the transistor Q13b is connected to the drain of the transistor Q5b, and a node N2b between the transistors Q13b and Q5b is connected to a current mirror circuit 16b.

The current mirror circuit 16b includes NMOS transistors Q14b and Q15b. The drain of the transistor Q14b is connected to the node N2b. The sources of the transistors Q14b and Q15b are connected to the low-potential power supply VS and the drain of the transistor Q14b is connected to the gates of the transistors Q14b and Q15b.

The transistor Q15b is located at the last output stage, and its drain is connected to the output terminal To. The transistor Q14b is substantially the same size as each of the transistors Q12b, Q13b, Q1b and Q2b. The transistor Q15b is ten times the size of the transistor Q14b and produces a drain current that is ten times the current flowing the transistor Q14b.

The operational amplifier circuit 300 performs a push-pull operation as the gate voltages of the PMOS transistor Q11b and NMOS transistor Q15b are controlled such that the ON/OFF state of the transistor Q11b is always opposite the ON/OFF state of the transistor Q15b.

When the voltage of the input signal IP is higher than the voltage of the input signal IM, a gate voltage Vg(Q11b) at the node N1b or of the transistor Q11b is given by:

$$Vg(Q11b)=VS+V(Q3b)+V(Q7b)$$

where V(Q3b) is the saturation voltage (source-drain voltage) of the transistor Q3b and V(Q7b) is the saturation voltage of the transistor Q7b.

At this time, all the constant current of the transistor Q5b flows in the transistor Q13b because of the transistor Q10b, which operates in a common mode with the output-stage transistor Q11b, and the gate voltage of the transistor Q15b is set while pulling a current ten times the constant current from the drain of the transistor Q15b.

When the voltage of the input signal IP is lower than the voltage of the input signal IM, the gate voltage Vg(Q11b) of the transistor Q11b rises to a level given below.

$$Vg(Q11b)=VD-V(Q9b)$$

where V(Q9b) is the saturation voltage of the transistor Q9b.

At this time, all the constant current of the transistor Q5b flows in the transistor Q14b because of the transistor Q10b, which operates in a common mode with the output-stage transistor Q11b, so that the gate voltage of the transistor Q15b becomes equal to the voltage of the low-potential power supply VS.

As apparent from the above, the operational amplifier circuit 300 generates an operational amplifier output by applying voltages that lie substantially in the supply voltage range to the gates of the transistors Q11b and Q15b in an opposite phase manner.

The operational amplifier circuit 300 requires that when the voltages of the input signals IP and IM are substantially the same, the drain currents of the transistors Q11b and Q15b should be substantially identical.

When IP=IM, the currents flowing the transistors Q8b and Q9b are substantially identical. Therefore, the drain current of the transistor Q11b is determined by the ratio of the size of the transistor Q11b to the sizes of the transistors Q8b and Q9b. The drain current of the transistor Q15b is determined by the drain current of the transistor Q10b and the ratio of the size of the current mirror circuit 15b to the size of the current mirror circuit 16b.

As apparent from the above, a voltage that lies substantially in the supply voltage range is applied to the gate of the transistor Q11b, and the full current driving performance of the transistor is demonstrated. The full current driving performance of the transistor Q7b is demonstrated by adjusting the size of the transistor Q15b such that when the voltages of the input signals IP and IM are substantially identical, the current flowing the transistor Q13b becomes larger and the current flowing the transistor Q14b becomes smaller.

However, only the last stage transistor Q11b performs voltage-current conversion as seen from the transistors Q8b and Q9b in the push operation of the operational amplifier circuit 300, while the operations of the transistors Q10b and Q13b and the last stage transistor Q15b are needed in the pull operation. This makes the operational speed of the operational amplifier circuit 300 of the second prior art relatively slow.

FIG. 4 is a schematic circuit diagram of an operational amplifier circuit 400 according to third prior art circuit which is preferred for fast operation. In the operational amplifier circuit 400, a transistor Q15b at the last output stage is driven by the drain voltage of a transistor Q8b, which shows a voltage change opposite to a voltage change at a node N1b.

A node N3b between the transistors Q8b and Q6b is connected to the gate of a PMOS transistor Q10b. The gate of the transistor Q15b at the last output stage is connected to the gate of an NMOS transistor Q12b to which the drain current of the transistor Q10b is supplied. The operational amplifier circuit 400 does not have the NMOS transistors Q13b and Q14b and the transistors Q2b, Q4b and Q5b shown in FIG. 3.

In the operational amplifier circuit 400, the transistors Q12b and Q15b perform voltage-current conversion as seen from the transistors Q8b and Q9b. Therefore, the operational amplifier circuit 400 operates faster than the operational amplifier circuit 300 of FIG. 3.

The transistor Q10b is connected to the drain and gate of the transistor Q8b and forms a current mirror circuit together with the transistor Q8b. When the voltages of the input signals IP and IM are not identical, therefore, only the current that is the twice as large as the current that flows when the voltages of the input signals IP and IM are identical flows in the transistor Q15b. While the operational amplifier circuit 400 operates fast, therefore, the output driving performance falls.

FIG. 5 is a schematic circuit diagram of a current output circuit 500 according to fourth prior art circuit.

The current output circuit 500 includes a current mirror circuit 11c and a current source 12c. The current mirror circuit 11c includes PMOS transistors Q11c and Q12c. The sources of the transistors Q11c and Q12c are connected to a high-potential power supply VD and the drain of the transistor Q11c is connected to the gates of the transistors Q11c and Q12c.

The drain of the transistor Q11c is connected to the current source 12c, and the drain of the transistor Q12c is connected to an output terminal OUT. As a predetermined voltage is applied to the output terminal, a current I12c, which is substantially the same as the drain current of the transistor Q11c (i.e., the current I11c of the current source 12c), flows in the transistor Q12c. That is, the current output circuit 500 outputs the current I12c, which is substantially the same as the input current I11c.

The current output circuit 500 is used in an analog circuit. Depending on the structure of the analog circuit, PMOS transistors are replaced with NMOS transistors.

FIG. 6 is a schematic circuit diagram of an analog switch circuit 600 according to fifth prior art circuit.

The analog switch circuit 600 includes a current source 21c, a current mirror circuit 22c, a differential pair 23c and a current mirror circuit 24c.

The current source 21c supplies a current I21c to the current mirror circuit 22c. The current mirror circuit 22c includes NMOS transistors Q21c and Q22c. The drain of the transistor Q21c is connected to the current source 21c. The sources of the transistors Q21c and Q22c are connected to a low-potential power supply VS and the drain of the transistor Q21c is connected to the gates of the transistors Q21c and Q22c. The transistor Q22c is double the size of the transistor Q21c and its drain is connected to the differential pair 23c. The transistor Q22c supplies the differential pair 23c with a bias current I22c that is double the drain current of the transistor Q21c (i.e., the current I21c of the current source 21c).

The differential pair 23c includes NMOS transistors Q23c and Q24c. A node between the sources of the transistors Q23c and Q24c is connected to the drain of the transistor Q22c. The drains of the transistors Q23c and Q24c are respectively connected to the drains of PMOS transistors Q25c and Q26c of the current mirror circuit 24c. The sources of the transistors Q25c and Q26c are connected to a high-potential power supply VD, and the drain of the transistor Q25c is connected to the gates of the transistors Q25c and Q26c. The gate of the transistor Q23c is connected to an input terminal Ti to which an input signal VIN is supplied. The gate of the transistor Q24c is connected to an output terminal To and the drain of the transistor Q24c. An output signal VOUT is output from the output terminal To.

The analog switch circuit 600 transfers only the voltage component to the output terminal To from the input terminal Ti. In other words, the analog switch circuit 600 does not transfer the current component. When drain currents I23c and I24c of the transistors Q23c and Q24c become substantially equal to each other, the source-gate voltages Vgs of the transistors Q23c and Q24c become substantially equal to each other. When the same drain current is supplied from the transistors Q25c and Q26c, therefore, the output signal VOUT, the voltage of which is substantially equal to the voltage of the input signal VIN, is output from the output terminal To.

MOS transistors have capacitors with respect to the individual terminals and individual node voltages are determined by charge and discharge of the capacitors. In the current output circuit 500, for example, as the capacitor of the transistor Q11c is charged and discharged by the high-potential power supply VD and the current source 12, the gate voltage of the transistor Q12c is determined. The charge/discharge time is determined by a capacitor and the time constant of resistor and current. The greater the sizes of the transistors Q11c and Q12c become or the smaller the current that flows becomes, the longer the charge/discharge time becomes.

The operational speed of the analog switch circuit 600 of FIG. 6 is determined by the operational speeds of the differential pair 23c and the current mirror circuit 24c. The operational speed of the operational amplifier circuit 400 of FIG. 4 is determined by the differential input circuit 14b, the transistors Q10b and Q11b and the current mirror circuit that includes the transistors Q12b and Q15b.

In short, the operational speeds of the current output circuit 500, the analog switch circuit 600 and the operational amplifier circuit 400 are affected by the operational speed of the current mirror circuit. That is, the operational time of the current mirror circuit prevents the operational speed of the entire circuit from being improved.

SUMMARY OF THE INVENTION

Accordingly, it is a first object of the present invention to provide a rail-to-rail type operational amplifier circuit that has an improved common mode rejection ratio and improved frequency characteristic.

It is a second object of the present invention to provide an operational amplifier circuit that operates at a high speed and has an improved output driving performance.

It is a third object of the present invention to provide a current output circuit, analog switch circuit and operational amplifier circuit that operate at a high speed.

In a first aspect of the present invention, an operational amplifier circuit is provided that includes a first differential pair, which includes a first transistor responsive to a first input voltage and a second transistor responsive to a second input voltage, and a second differential pair, which includes a third transistor responsive to the first input voltage and a fourth transistor responsive to the second input voltage. A fifth transistor is connected to the first and third transistors. A sixth transistor is connected to the second and fourth transistors. A first current source, which is connected to the first differential pair, supplies a first bias current to the first differential pair. A second current source, which is connected to the second differential pair, supplies a second bias current to the second differential pair. A third current source, which is connected to the fifth transistor, supplies a third bias current to the fifth transistor. A fourth current source, which is connected to the sixth transistor, supplies a fourth bias current to the sixth transistor. A control circuit, which is connected to the first to fourth current sources, receives the first and second input voltages and controls the first to fourth current sources such that the sum of the first and second bias currents is constant and the second to fourth bias currents become substantially equal.

In a second aspect of the present invention, an operational amplifier circuit is provided that includes a first differential pair, which includes a first transistor responsive to a first input voltage and a second transistor responsive to a second input voltage, and a second differential pair, which includes a third transistor responsive to the first input voltage and a fourth transistor responsive to the second input voltage. A first resistor element is connected to the first and third transistors. A second resistor element is connected to the second and fourth transistors. A first current source, which is connected to the first differential pair, supplies a first bias current to the first differential pair. A second current source, which is connected to the second differential pair, supplies a second bias current to the second differential pair. A third current source, which is connected to the first resistor element, supplies a third bias current to the first resistor element. A fourth current source, which is connected to the second resistor element, supplies a fourth bias current to the second resistor element. A control circuit, which is connected to the first to fourth current sources, receives the first and second input voltages and controls the first to fourth current sources such that the sum of the first and second bias currents is constant and the second to fourth bias currents become substantially equal.

In a third aspect of the present invention, a method of controlling first and second bias currents respectively supplied to first and second differential pairs of an operational amplifier circuit is provided. The second bias current is controlled in accordance with one of first and second input voltages. The first bias current is controlled using a predetermined constant current and a current substantially equal to the second bias current.

In a fourth aspect of the present invention, an operational amplifier circuit is provided that includes a first differential pair, which receives a first bias current and operating in response to first and second input voltages, and a second differential pair, which receives a second bias current and operating in response to the first and second input voltages. A first current source is connected to the first differential pair. A second current source, which is connected to the second differential pair, produces the second bias current. A control circuit, which is connected to the first and second current sources, controls the first current source such that the first current source produces a constant current. The control circuit produces the first bias current at a node between the first differential pair and the first current source by adding a current that is substantially equal to the second bias current to the constant current in accordance with one of the first and second input voltages.

In a fifth aspect of the present invention, an operational amplifier circuit is provided that includes a first differential pair including a first P channel transistor responsive to a first input voltage and a second P channel transistor responsive to a second input voltage. The first differential pair receives a first bias current. A second differential pair includes a first N channel transistor responsive to the first input voltage and a second N channel transistor responsive to the second input voltage. The second differential pair receives a second bias current. A first current source includes a third P channel transistor connected between the first differential pair and a high-potential power supply. A second current source, which includes a third N channel transistor connected between the second differential pair and a low-potential power supply, produces the second bias current. A control circuit controls the first current source such that the first current source produces a predetermined constant current and controls the first and second bias currents. The control circuit includes a third current source, which is connected to the second current source. The third current source includes a fourth N channel transistor that produces a current substantially equal to the second bias current. The control circuit includes a fifth N channel transistor connected to the fourth N channel transistor and a node between the first current source and the first differential pair. The fifth N channel transistor is responsive to one of the first and second input voltages.

In a sixth aspect of the present invention, an operational amplifier circuit is provided that includes a first differential pair including a first P channel transistor responsive to a first input voltage and a second P channel transistor responsive to a second input voltage. The first differential pair receives a first bias current. A second differential pair includes a first N channel transistor responsive to the first input voltage and a second N channel transistor responsive to the second input voltage. The second differential pair receives a second bias current. A first current source includes a third P channel transistor connected between the first differential pair and a high-potential power supply. A second current source, which includes a third N channel transistor connected between the second differential pair and a low-potential power supply, produces the second bias current. A control circuit controls the second current source such that the second current source produces a predetermined constant current and controls the first and second bias currents. The control circuit includes a third current source connected to the first current source. The third current source includes a fourth P channel transistor that produces a current substantially equal to the first bias current. The control circuit includes a fifth P channel transistor connected to the fourth P channel transistor and a node between the second current source and the second differential pair. The fifth P channel transistor is responsive to one of the first and second input voltages.

In a seventh aspect of the present invention, a control circuit, which is connected to a first power supply, is provided. The control circuit controls a first output current flowing in a first current source including a first transistor cascade-connected to a second transistor that has the same polarity as that of the first transistor. The control circuit includes a second current source connected to the first power supply. The second current source includes a third transistor, a second output current that is substantially equal to the first output current flows to the second current source. A fourth transistor is cascade-connected to the third transistor. The fourth transistor has the same polarity as that of the third transistor, and the second and fourth transistors control the first and second output currents by controlling saturation/non-saturation of the first and third transistors in accordance with a voltage signal. A third current source, which is connected to the second power supply, produces a third output current. A fourth output current, the phase of which is opposite to that of the first output current, is produced by adding the second output current and the third output current.

In an eighth aspect of the present invention, a current output circuit is provided that includes a constant current source circuit that includes a first transistor and a first resistor element connected between the gate and the source of the first transistor. The constant current source circuit makes a first current flowing across the first resistor element equal to a first drain current flowing in the first transistor. An output stage circuit includes a second transistor and a second resistor element connected between the gate and the source of the second transistor. The resistance of the second resistor element is proportional to the resistance of the first resistor element. The output stage circuit produces a second current from the first current in accordance with a current ratio expressed by a reciprocal of a ratio of the resistance of the first resistor element to the resistance of the second resistor element and sets a gate voltage of the second transistor by supplying the second current to the second resistor element.

In a ninth aspect of the present invention, a current output circuit is provided that includes a first transistor, the drain of which receives a first current, a first resistor element connected between the gate and the source of the first transistor. The gate of a second transistor is connected to the drain of the first transistor and the source thereof is connected to the gate of the first transistor. A drain current is generated at the drain of the second transistor. The resistance of a second resistor element is related to the resistance of the first resistor element. The size of a third transistor is related to the size of the first transistor. The second resistor element is connected between the gate and the source of the third transistor. A second current originating from the drain current of the second transistor is supplied to the gate of the third transistor. A third current, which is related to the first current, is produced at the drain of the third transistor.

In a tenth aspect of the present invention, an analog switch circuit is provided that includes a first transistor, the drain of which receives a first current, a first resistor element connected between the gate and the source of the first transistor, and a second transistor, the gate of which is connected to the drain of the first transistor and the source of which is connected to the gate of the first transistor. A drain current is generated at the drain of the second transistor. A differential pair includes an input transistor, the source of which receives a second current originating from the drain current of the second transistor and the gate of which receives an input signal. The differential pair includes an output transistor, the source of which receives the second current, the gate of which is connected to an output terminal of the analog switch circuit, and the drain of which is connected to the gate of the output transistor. A second resistor element is connected to the drain of the input transistor. The resistance of the second resistor element is related to the resistance of the first resistor element. The size of a third transistor is related to the size of the first transistor. The second resistor element is connected between the gate and the source of the third transistor, the drain of the third transistor is connected to the drain of the output transistor. A third current, which is related to the first current, is generated at the drain of the third transistor.

In an eleventh aspect of the present invention, an operational amplifier circuit is provided that includes a first transistor the drain of which receives a first current, a first resistor element connected between the gate and the source of the first transistor, and a second transistor, the gate of which is connected to the drain of the first transistor and the source of which is connected to the gate of the first transistor. A differential pair includes first and second differential transistors, the sources of which receive a second current originating from the drain current of the second transistor and the gates of which respectively receive first and second input signals. Second and third resistor elements are respectively connected to the drains of the first and second differential transistors. A third transistor has the gate which is connected to a first node between a first terminal of the second resistor element and the drain of the first differential transistor. The source of the third transistor is connected to a second terminal of the second resistor element. A third current, which is related to the first current, is generated at the drain of the third transistor. A first output transistor has the gate which is connected to a second node between a third terminal of the third resistor element and the drain of the second differential transistor. The source of the first output transistor is connected to a fourth terminal of the third resistor element. A fourth current, which is related to the first current, is generated at the drain of the first output transistor. A fourth resistor element is connected to the drain of the third transistor. A second output transistor has the gate which is connected to a third node between the drain of the third transistor and the fourth resistor element. The source of the second output transistor is connected to the fourth resistor element. A fifth current, which corresponds to a gate voltage of the third transistor, is generated at the drain of the second output transistor based on the third current.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

Figure 7:
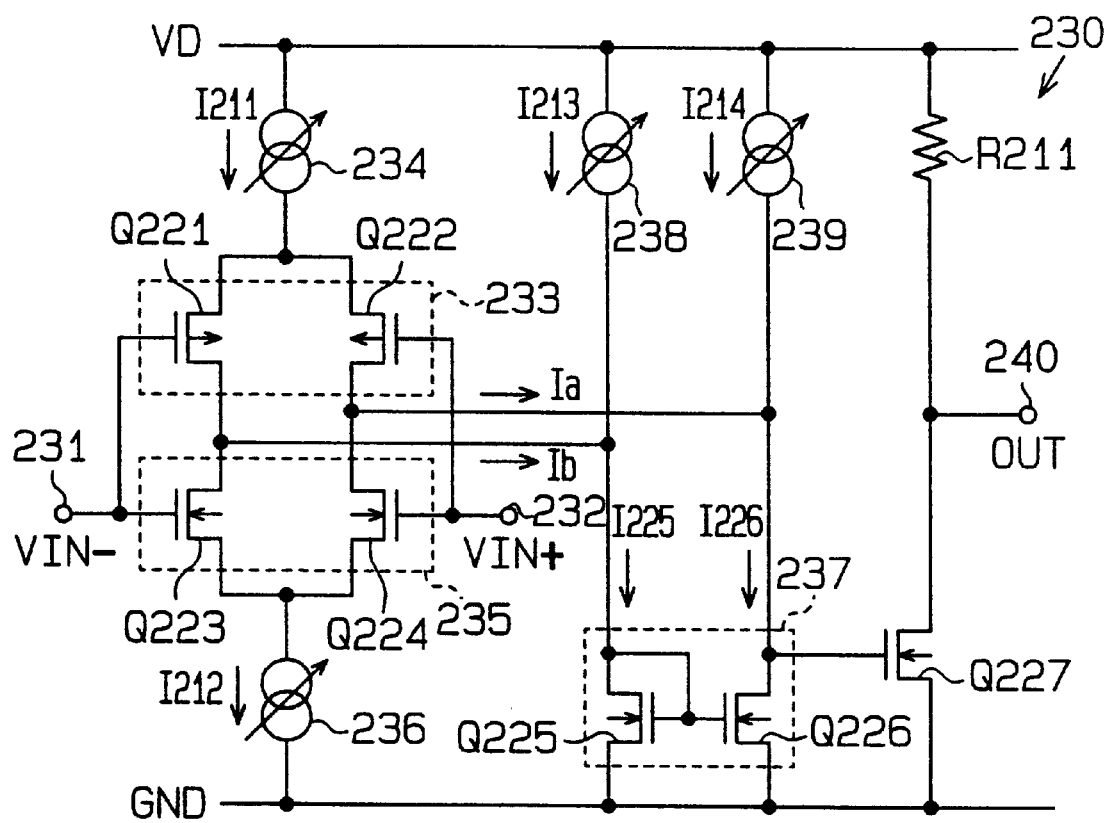
FIG. 7 is a circuit diagram of an operational amplifier circuit according to a first embodiment of the present invention.

FIG. 7 is a schematic circuit diagram of a rail-to-rail type operational amplifier circuit 230 according to the first embodiment of the present invention.

A first input voltage VIN– is applied to an inverting input terminal (negative input terminal) 231 of the operational amplifier circuit 230, and a second input voltage VIN+ is applied to the non-inverting input terminal (positive input terminal) 232 thereof. The input terminals 231 and 232 are respectively connected to the gates of PMOS transistors Q221 and Q222, which constitute a first differential pair 233. The sources of the transistors Q221 and Q222 are connected together and a node between the sources is connected to a high-potential power supply VD via a first current source 234, which supplies a bias current to the transistors Q221 and Q222. The input terminals 231 and 232 are also respectively connected to the gates of NMOS transistors Q223 and Q224, which constitute a second differential pair 235. The sources of the transistors Q223 and Q224 are connected together and a node between the sources is connected to a low-potential power supply GND via a second current source 236, which supplies a bias current to the transistors Q223 and Q224.

The drains of the transistors Q221 and Q222 are respectively connected to the drains of a pair of NMOS transistors Q225 and Q226, which constitute a first current mirror circuit 237. The drains of the transistors Q225 and Q226 are respectively connected to the drains of the transistors Q223 and Q224.

The drains of the transistors Q221 and Q223 are connected together, and a node between the drains is connected to the drain of the output-stage transistor Q225. The drains of the transistors Q222 and Q224 are connected together, and a node between the drains is connected to the drain of the output-stage transistor Q226.

The gates of the transistors Q225 and Q226 are connected together, and a node between the gates is connected to the drain of the transistor Q225. The source of the transistor Q225 is connected to the low-potential power supply GND, and the drain thereof is connected to the high-potential power supply VD via a third current source 238. The source of the transistor Q226 is connected to the low-potential power supply GND, and the drain thereof is connected to the high-potential power supply VD via a fourth current source 239.

The drain of the transistor Q226 is connected to the gate of the NMOS transistor Q227 at the last output stage. The source of the transistor Q227 is connected to the low-potential power supply GND, and the drain thereof is connected to the high-potential power supply VD via a resistor R211. The drain of the transistor Q227 is connected to an output terminal 240.

Figure 2:
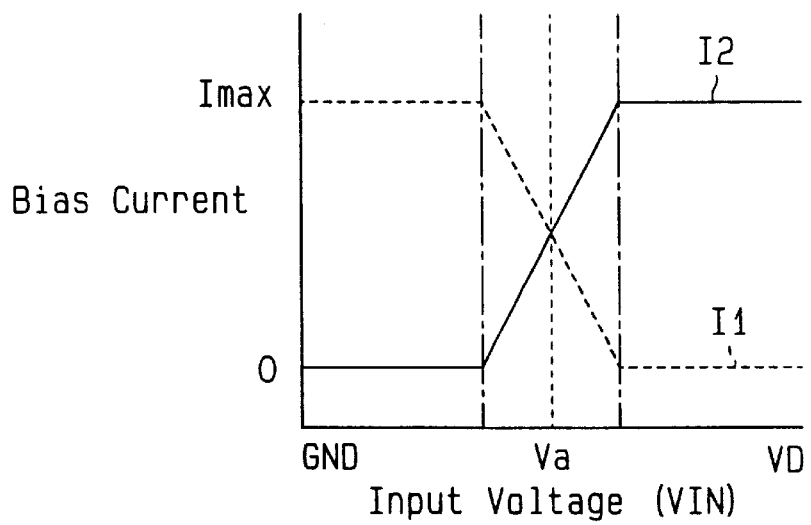
FIG. 2 is a waveform diagram illustrating distribution control of bias currents.
Figure 8:
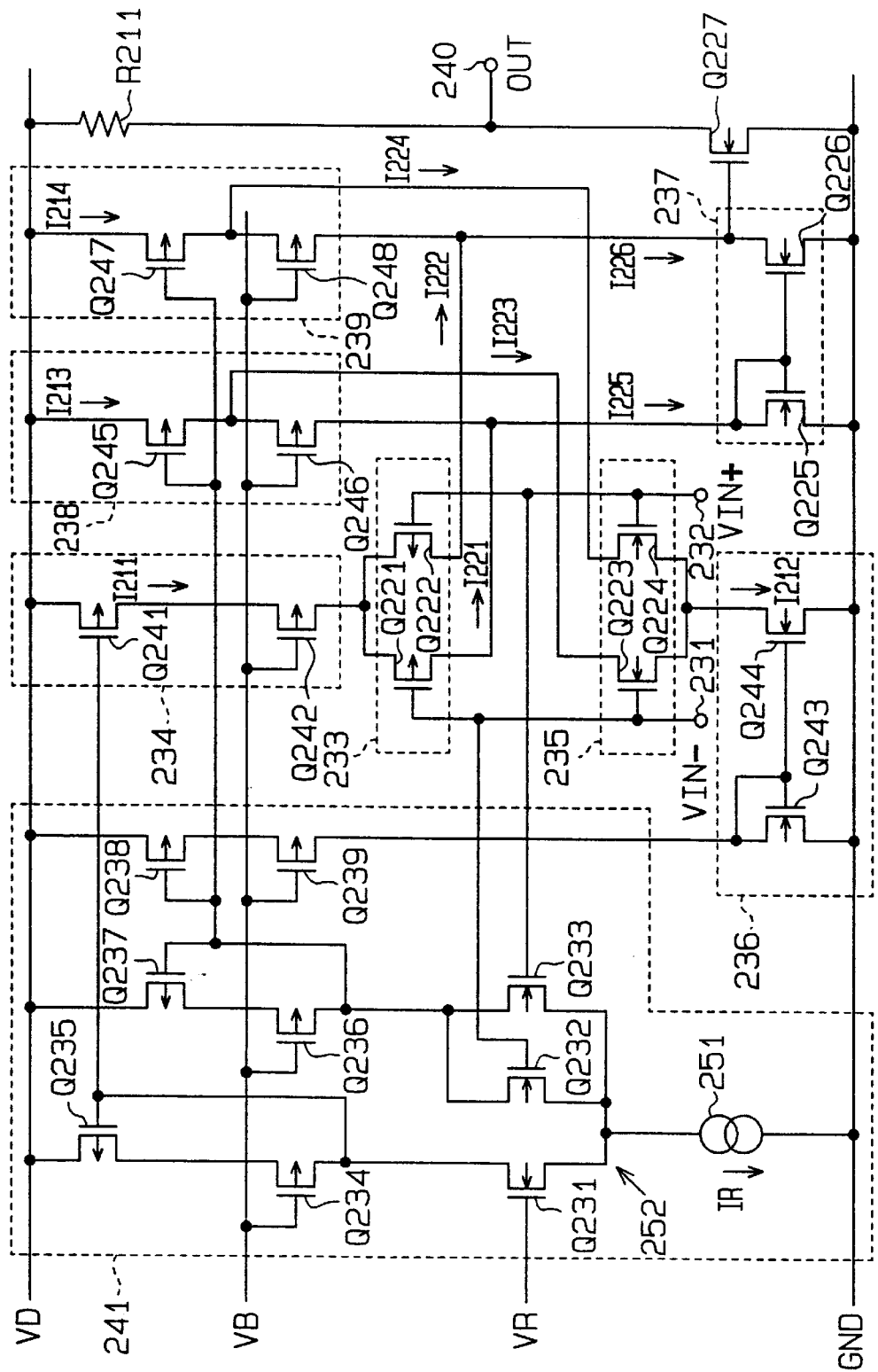
FIG. 8 is a circuit diagram of the operational amplifier circuit according to the first embodiment of the present invention.

A control circuit 241 of FIG. 8 controls the first and second current sources 234 and 236 in accordance with the input voltages VIN+ and VIN– such that, as shown in FIG. 2, the total of bias currents I211 and I212 supplied from the first and second current sources 234 and 236 becomes constant. The control circuit 241 controls the third and fourth current sources 238 and 239 in such that the third and fourth current sources 238 and 239 supply currents I213 and I214, which are substantially equal to the bias current I212 of the second current source 236.

The operation of the operational amplifier circuit 230 will be described below.

The bias current I211 of the first current source 234 is supplied to the transistors Q225 and Q226 via the transistors Q221 and Q222. The bias current I212 of the second current source 236 is supplied to the transistors Q225 and Q226 via the transistors Q223 and Q224.

The current from the first current source 234 joins the current from the second current source 236, and currents Ia and Ib are respectively supplied to the output-stage transistors Q225 and Q226 from the current merging point. The first and second current sources 234 and 236 are controlled so that the sum of their currents is always constant. The second to fourth current sources 236, 238 and 239 are controlled to supply substantially identical currents I212 to I214.

The following is the analysis of the currents I225 and I226 when the positive input voltage and the negative input voltage are the same. It is assumed here that the direction of the arrows in FIG. 7 is the positive current direction and IR is the total current of the currents from the first and second current sources 234 and 236.

(1) When I212=0,

Because I211+I212=IR,

I211=IR

Because I212=I213=I214,

I212=I213=I214=0

Since the first and second input voltages VIN– and VIN+ have the same values, the same current flows in the transistors Q221 and Q222. Thus, Ia=0.5×IR Ib=0.5×IR Thus,

I225=0.5×IR

I226=0.5×IR (2) When I211=I212,

Because I211+I212=IR,

I211=I212=0.5×IR

Because I212=I213=I214,

I212=I213=I214=0.5×IR

Thus,
Ia=0
Ib=0
Thus,
I226=I213=0.5×IR
I226=I214=0.5×IR
(3) When I211=0,
Because I211+I212=IR,
I212=IR
Because I212=I213=I214,
I212=I213=I214=IR
Thus,
Ia=0.5×(−IR)
Ib=0.5×(−IR)
Thus,
I225=I213=0.5×IR
I226=I214=0.5×IR As apparent from the above, the currents that pass the output-stage transistors Q225 and Q226 are constant regardless of the distribution ratio of the current I211 of the first current source 234 to the current I212 of the second current source 236.

The current I211 of the first current source 234 is supplied to the output-stage transistors Q225 and Q226 via the first differential pair 233, and the current I212 of the second current source 236 is supplied to the transistors Q225 and Q226 via the second differential pair 235. Therefore, there is no time lag between the control of the output-stage transistors Q225 and Q226 using the current I211 of the first current source 234 and the control of the output-stage transistors Q225 and Q226 using the current I212 of the second current source 236. This leads to an improvement on the common mode rejection ratio.

The details of the operational amplifier circuit 230 will be discussed below referring to FIG. 8.

The control circuit 241 includes a constant current source 251, which supplies a constant current IR, and a bias current control circuit 252, which distributes the current IR to the first and second current sources 234 and 236 based on the first and second input voltages VIN− and VIN+.

The bias current control circuit 252 includes NMOS transistors Q231, Q232 and Q233. The sources of the transistors Q231, Q232 and Q233 are connected to the low-potential power supply GND via the constant current source 251. A reference voltage VR is applied to the gate of the first transistor Q231, the first input voltage VIN− is applied to the gate of the second transistor Q232, and the second input voltage VIN+ is applied to the gate of the third transistor Q233. The bias current control circuit 252 compares the reference voltage VR with the first and second input voltages VIN− and VIN+ and distributes the constant current IR to the first and second current sources 234 and 236.

The drain of the first transistor Q231 is connected to the high-potential power supply VD via PMOS transistors Q234 and Q235. A bias voltage VB is applied to the gate of the transistor Q234. The gate and drain of the transistor Q235 are connected together via the transistors Q234. The gate of the transistor Q235 is connected to the first current source 234.

The drains of the second and third transistors Q232 and Q233 are connected together, and a node between the drains is connected to the high-potential power supply VD via PMOS transistors Q236 and Q237. The bias voltage VB is applied to the gate of the transistor Q236. The gate and drain of the transistor Q237 are connected together via the transistors Q236. The gate of the transistor Q237 is connected to the transistor Q238 and the third and fourth current sources 238 and 239.

The source of the transistor Q238 is connected to the high-potential power supply VD and the drain thereof is connected to the second current source 236 via a PMOS transistor Q239. The transistors Q238 and Q237 form a current mirror circuit, which supplies the second current source 236 with a current that is substantially equal to the currents passing the transistors Q232 and Q233.

The first current source 234 includes PMOS transistors Q241 and Q242. The source of the transistor Q241 is connected to the high-potential power supply VD and the drain thereof is connected to the first differential pair 233 via the transistors Q242. The bias voltage VB is applied to the gate of the transistor Q242. The gate of the transistor Q241 is connected to the gate of the transistors Q235. The transistors Q241 and Q235 form a current mirror circuit, and the current I211, which is substantially equal to the current passing the first transistor Q231, flows in the transistor Q241.

The second current source 236 includes NMOS transistors Q243 and Q244. The source of the transistor Q243 is connected to the low-potential power supply GND and the drain thereof is connected to the drain of the transistor Q238 via the transistor Q239. The gate of the transistor Q243 is connected to the drain thereof and to the gate of the transistor Q244. The source of the transistor Q244 is connected to the low-potential power supply GND and the drain thereof is connected to the second differential pair 235. The transistors Q243 and Q244 form a current mirror circuit, and the current I212, which is substantially equal to the current passing the transistor Q238, i.e., a current equal to the sum of the currents passing the second and third transistors Q232 and Q233, flows in the transistor Q244.

The third current source 238 includes PMOS transistors Q245 and Q246. The source of the transistor Q245 is connected to the high-potential power supply VD and the drain thereof is connected to the transistors Q225 via the transistors Q246. The bias voltage VB is applied to the gate of the transistor Q246. The gate of the transistor Q245 is connected to the gate of the transistors Q237. The transistors Q245 and Q237 form a current mirror circuit and the current I213, which is substantially equal to the sum of the currents passing the second and third transistors Q232 and Q233, flows in the transistor Q245.

The fourth current source 239 includes PMOS transistors Q247 and Q248. The source of the transistor Q247 is connected to the high-potential power supply VD and the drain thereof is connected to the transistor Q226 via the transistor Q248. The bias voltage VB is applied to the gate of the transistor Q248. The gate of the transistor Q247 is connected to the gate of the transistor Q237. The transistors Q247 and Q237 form a current mirror circuit, and the bias current I214, which is substantially equal to the sum of the currents passing the second and third transistors Q232 and Q233, flows in the transistor Q247.

The transistors Q234, Q236, Q239, Q242, Q246 and Q248 form a cascade stage with respect to the current mirror circuit that includes the transistors Q235 and Q241 and the current mirror circuit that includes the transistors Q237, Q238, Q245 and Q247.

A description will now be given of the operation of the operational amplifier circuit 230 in a static state where the first and second input voltages VIN− and VIN+ are identical.

The current IR of the constant current source 251 is expressed by "A" and the currents that pass through the transistors Q221, Q222, Q223, Q224, Q225 and Q226 are respectively expressed by "I221", "I222", "I223", "I224", "I225"and "I226".

(1) When Reference Voltage VR>Input Voltage VIN+, VIN−

Most of the constant current IR is distributed to the first transistor Q231. Suppose that the current passing the first transistor Q231 is 0.8 A, and the sum of currents passing the second and third transistors Q232 and Q233 is 0.2 A.

The current passing the first transistor Q231 is supplied to the transistors Q221 and Q222 of the first differential pair 233 by the current mirror circuit of the transistors Q235 and Q241. Because of the static state where the input voltages VIN+ and VIN− are identical, the input current is evenly distributed to the transistors Q221 and Q222 in the operational amplifier circuit 230. Thus, I221=I222=0.4 A.

The currents passing the second and third transistors Q232 and Q233 are supplied to the transistors Q223 and Q224 of the second differential pair 235 by the current mirror circuit of the transistors Q237, Q238, Q243 and Q244, and the input current is evenly distributed to the transistors Q223 and Q224. Thus, I224=I223=0.1 A.

The currents passing the transistors Q232 and Q233 become I213=I214=0.2 A because of the current mirror circuit of the transistors Q237, Q245 and Q247.

The currents I225 and I226 that flow to the output-stage transistors are computed as follows.

$$I225 = I213 - I223 + I221$$
$$= 0.2\ A - 0.1\ A + 0.4\ A$$
$$= 0.5\ A$$

$$I226 = I214 - I224 + I222$$
$$= 0.2\ A - 0.1\ A + 0.4\ A$$
$$= 0.5\ A$$

(2) When Reference Voltage VR=Input Voltage VIN+, VIN−

The constant current IR is evenly distributed to the first transistor Q231 and the second and third transistors Q232 and Q233.

The current passing the transistor Q231 is supplied to the transistors Q221 and Q222 by the current mirror circuit of the transistors Q235 and Q241. In the static state, the input current is evenly distributed to the transistors Q221 and Q222. Thus, I221=I222=0.25 A.

The currents passing the transistors Q232 and Q233 are supplied to the transistors Q223 and Q224 by the current mirror circuit of the transistors Q237, Q238, Q243 and Q244. The input current is evenly distributed to the transistors Q223 and Q224. Thus, I224=I223=0.25 A.

Because of the current mirror circuit of the transistors Q237, Q245 and Q247, I213 =I214=0.5 A.

The currents I225 and I226 that flow to the output-stage transistors are computed as follows.

$$I225 = I213 - I223 + I221$$
$$= 0.5\ A - 0.25\ A + 0.25\ A$$
$$= 0.5\ A$$

$$I226 = I214 - I224 + I222$$
$$= 0.5\ A - 0.25\ A + 0.25\ A$$
$$= 0.5\ A$$

(3) When reference voltage VR<input voltage VIN+, VIN−

A little of the constant current IR is distributed to the first transistor Q231. Suppose that the current passing the first transistor Q231 is 0.2 A, and the sum of currents passing the second and third transistors Q232 and Q233 is 0.8 A.

The current passing the first transistor Q231 is supplied to the transistors Q221 and Q222 by the current mirror circuit of the transistors Q235 and Q241. In the static state, the input current is evenly distributed to the transistors Q221 and Q222. Thus, I222=I221=0.1 A.

The currents passing the second and third transistors Q232 and Q233 are supplied to the transistors Q223 and Q224 by the current mirror circuit of the transistors Q237, Q238, Q243 and Q244. In the static state, the input current is evenly distributed to the transistors Q223 and Q224. Thus, I224=I223=0.4 A.

Because of the current mirror circuit of the transistors Q237, Q245 and Q247, I213=I214=0.8 A.

The currents I225 and I226 that flow to the output-stage transistors are computed as follows.

$$I225 = I213 - I223 + I221$$
$$= 0.8\ A - 0.4\ A + 0.1\ A$$
$$= 0.5\ A$$

$$I226 = I214 - I224 + I222$$
$$= 0.8\ A - 0.4\ A + 0.1\ A$$
$$= 0.5\ A$$

The operational amplifier circuit 230 of the first embodiment has the following advantages.

(1) The control circuit 241 controls the first to fourth current sources 234, 236, 238 and 239 based on the first and second input voltages VIN− and VIN+ such that the sum of the bias currents I211 and I212 of the first and second current sources 234 and 236 is maintained constant and the bias currents I212, I213 and I214 of the second'to fourth current sources 236, 238 and 239 become substantially equal to each other. As a result, the currents passing the output-stage transistors Q225 and Q226 are maintained constant irrespective of the first and second input voltages VIN− and VIN+, thus leading to an improved common mode rejection ratio.

(2) The transistors Q221 and Q223 of the first and second differential pairs 233 and 235, which receive the first input voltage VIN−, are connected to the output-stage transistor Q225, and the transistors Q222 and Q224 of the first and second differential pairs 233 and 235, which receive the second input voltage VIN+, are connected to the output-stage transistor Q226. Therefore, there occurs no time lag between the control of the output-stage transistors by the first differential pair 233 and the control of the output-stage transistors by the second differential pair 235. This results in an improved frequency characteristic.

The first embodiment may be modified as follows:

In the first embodiment, the output-stage transistors Q225 and Q226 may be replaced with resistor elements that have the same resistance. In this case, an output-stage transistor having a gate connected to a node between the associated resistor element and the third current source 238 may be additionally provided. A complementary operational amplifier output signals can be acquired from the additional output-stage transistor and the output-stage transistor Q227.

All or some of the NMOS transistors in the first embodiment may be replaced with NPN bipolar transistors, and all or some of the PMOS transistors may be replaced with PNP bipolar transistors.

A rail-to-rail type operational amplifier circuit 340 according to the second embodiment of the invention will now be described with reference to FIGS. 9 to 11.

Figure 9:
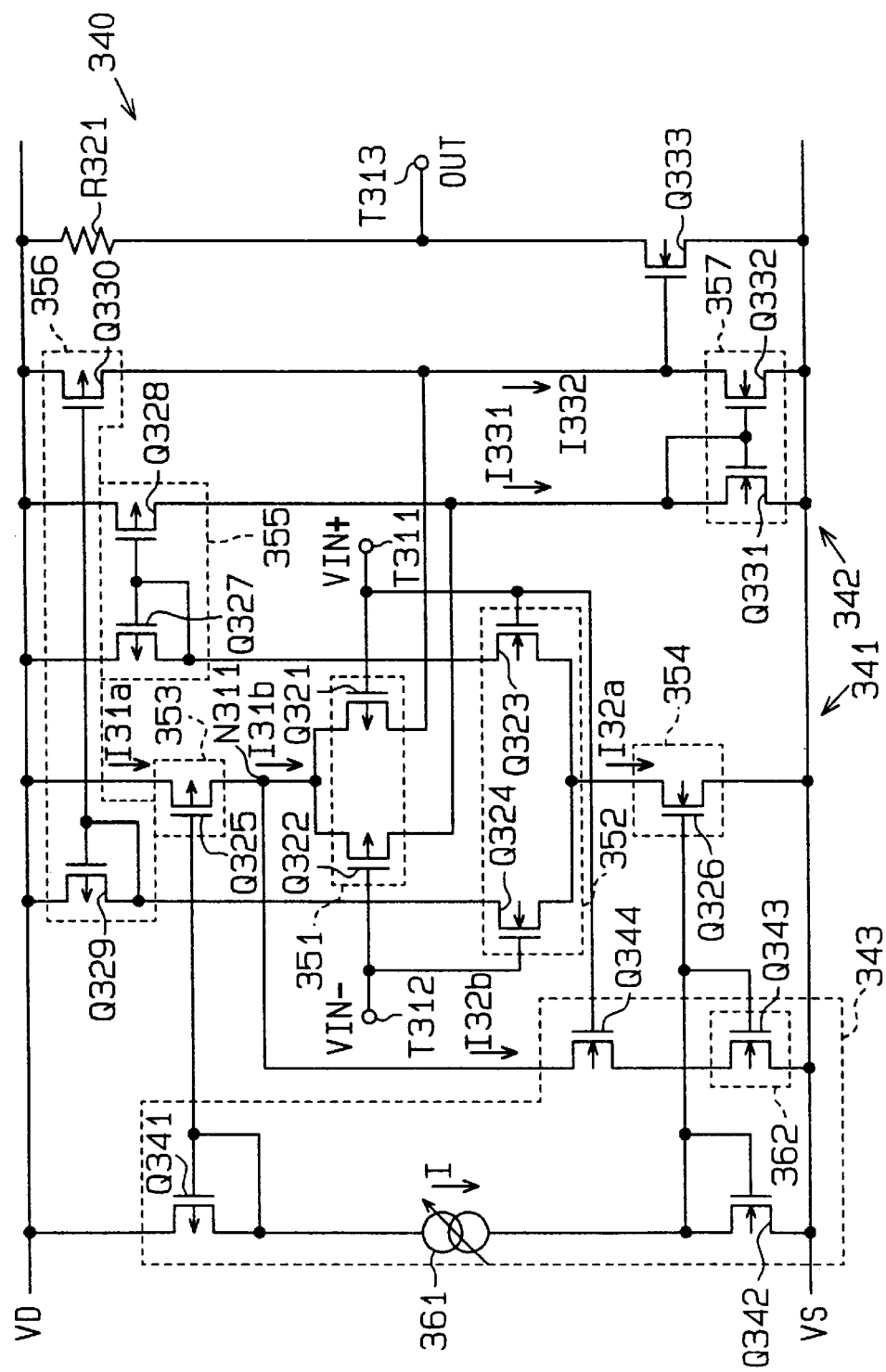
FIG. 9 is a schematic circuit diagram of an operational amplifier circuit according to a second embodiment of the present invention.

As shown in FIG. 9, the operational amplifier circuit 340 has an input stage circuit 341, an output stage circuit 342 and a control circuit 343.

The input stage circuit 341 includes a low-input-voltage differential pair (first input differential pair) 351, a high-input-voltage differential pair (second input differential pair) 352, a high-voltage current source (first current source) 353 and a low-voltage current source (second current source) 354.

The first input differential pair 351 includes PMOS transistors Q321 and Q322. The gate of the transistor Q321 is connected to the non-inverting input terminal (positive input terminal), T311, of the operational amplifier circuit 340 to which the first input voltage VIN+ is supplied. The gate of the transistor Q322 is connected to the inverting input terminal (negative input terminal), T312, of the operational amplifier circuit 340 to which the second input voltage VIN− is supplied. The sources of the transistors Q321 and Q322 are connected together, and a node between the sources is connected to a high-potential power supply VD via the first current source 353. The drains of the transistors Q321 and Q322 are connected to the output stage circuit 342. The first current source 353 supplies a bias current to the transistors Q321 and Q322.

The second input differential pair 352 includes NMOS transistors Q323 and Q324. The gate of the transistor Q323 is connected to the first input terminal T311 to which the first input voltage VIN+ is supplied. The gate of the transistor Q324 is connected to the second input terminal T312 to which the second input voltage VIN− is supplied. The sources of the transistors Q323 and Q324 are connected together, and a node between the sources is connected to a low-potential power supply VS via the second current source 354. The drain of the transistor Q323 is connected to the output stage circuit 342 via a current mirror circuit 355. The drain of the transistor Q324 is connected to the output stage circuit 342 via a current mirror circuit 356. The second current source 354 supplies a bias current to the transistors Q323 and Q324.

The first current source 353 includes a PMOS transistor Q325. The source of the transistor Q325 is connected to the high-potential power supply VD and the drain thereof is connected to the first input differential pair 351. The gate of the transistor Q325 is connected to the control circuit 343.

The second current source 354 includes an NMOS transistor Q326. The source of the transistor Q326 is connected to the low-potential power supply VS and the drain thereof is connected to the second input differential pair 352. The gate of the transistor Q326 is connected to the control circuit 343.

The current mirror circuit 355 includes a pair of PMOS transistors Q327 and Q328. The source of the transistor Q327 is connected to the high-potential power supply VD and the drain thereof is connected to the transistor Q323. The gate of the transistor Q327 is connected to the drain thereof and the gate of the transistor Q328. The source of the transistor Q328 is connected to the high-potential power supply VD and the drain thereof is connected to a current mirror circuit 357 of the output stage circuit 342.

The current mirror circuit 356 includes a pair of PMOS transistors Q329 and Q330. The source of the transistor Q329 is connected to the high-potential power supply VD and the drain thereof is connected to the transistor Q324. The gate of the transistor Q329 is connected to the drain thereof and the gate of the transistor Q330. The source of the transistor Q330 is connected to the high-potential power supply VD and the drain thereof is connected to the current mirror circuit 357.

The current mirror circuit 357 includes a pair of NMOS transistors Q331 and Q332. The source of the transistor Q331 is connected to the low-potential power supply VS and the drain thereof is connected to the drains of the transistors Q322 and Q328. The gate of the transistor Q331 is connected to the drain thereof and the gate of the transistor Q332. The source of the transistor Q332 is connected to the low-potential power supply VS and the drain thereof is connected to the drains of the transistors Q321 and Q330. The drain of the transistor Q332 is connected to the gate of the output-stage transistor Q333.

The output-stage transistor Q333 is preferably an NMOS transistor. The source of the transistor Q333 is connected to the low-potential power supply VS and the drain thereof is connected to the high-potential power supply VD via a resistor R321. The drain of the transistor Q333 is also connected to an output terminal T313 which outputs an operational amplifier output signal OUT.

The control circuit 343 controls the first current source 353 such that the first current source 353 provides a constant current I31$a$. The control circuit 343 produces a first bias current I31$b$ to be supplied to the first input differential pair 351. The constant current I31$b$ is produced by adding a current I32$b$ to the constant current I31$a$. The current I32$b$ is substantially equal to a second bias current I32$a$ to be supplied to the second input differential pair 352 from the second current source 354 based on the first input voltage VIN+. In the second embodiment, because the constant current I31$a$ is separated into the current I32$b$ and the first bias current I31$b$, the current I32$b$ has a negative value with respect to the first bias current I31$b$ from the viewpoint of the calculation.

The control circuit 343 includes constant current sources 361 and 362, a PMOS transistor Q341 and NMOS transistors Q342, Q343 and Q344. The first constant current source 361 is connected to the high-potential power supply VD via the transistor Q341 and to the low-potential power supply VS via the transistor Q342. The first constant current source 361 provides a constant current I.

The source of the transistor Q341 is connected to the high-potential power supply VD, and the drain thereof is connected to the constant current source 361. The gate of the transistor Q341 is connected to the drain thereof and the gate of the transistor Q325. The transistors Q341 and Q325 are connected in a current mirror fashion, so that the constant current I31$a$ equal to the current I from the constant current source 361 flows to the transistor Q325.

The source of the transistor Q342 is connected to the low-potential power supply VS, and the drain thereof is connected to the constant current source 361. The gate of the transistor Q342 is connected to the drain thereof and the gate of the transistor Q326.

The second constant current source 362 is preferably the NMOS transistor Q343. The NMOS transistor Q344, which has the same polarity as the transistor Q343, is cascade-connected to the transistor Q343. The transistors Q343 and Q344 respectively have the same electric characteristics as the transistors Q326 and Q323 and are connected in a manner similar to that of the transistors Q326 and Q323.

The source of the transistor Q343 is connected to the low-potential power supply VS, the drain thereof is connected to the source of the transistor Q344, and the gate thereof is connected to the gate of the transistor Q342. Therefore, the transistor Q343 is connected to the transistor Q342 in a current mirror fashion. The first input voltage VIN+ is applied to the gate of the transistor Q344 via the first input terminal T311.

As the gate voltage of the transistor Q323 is controlled by the first input voltage VIN+, the source voltage of the transistor Q323 (i.e., the drain voltage of the transistor Q326) is changed and the saturation/non-saturation of the transistor Q326 is controlled. As the gate voltage of the transistor Q344 is controlled by the first input voltage VIN+, the source voltage of the transistor Q344 (i.e., the drain voltage of the transistor Q343) is changed and the saturation/non-saturation of the transistor Q343 is controlled. Therefore, the current I32b, which is identical to the second bias current I32a flowing to the transistor Q326, flows to the transistor Q343.

The drain of the transistor Q344 is connected to a node N311 between the first current source 353 and the first input differential pair 351. Therefore, the current I31a that flows to the first current source 353 is separated into the first bias current I31b, which is supplied to the first input differential pair 351, and the current I32b, which flows to the transistor Q344. That is, the first bias current I31b, the phase of which is opposite to that of the second bias current I32a, is produced by adding the negative current I32b, which is substantially equal to the second bias current I32a, to the constant current I31a of the first current source 353.

Figure 1:
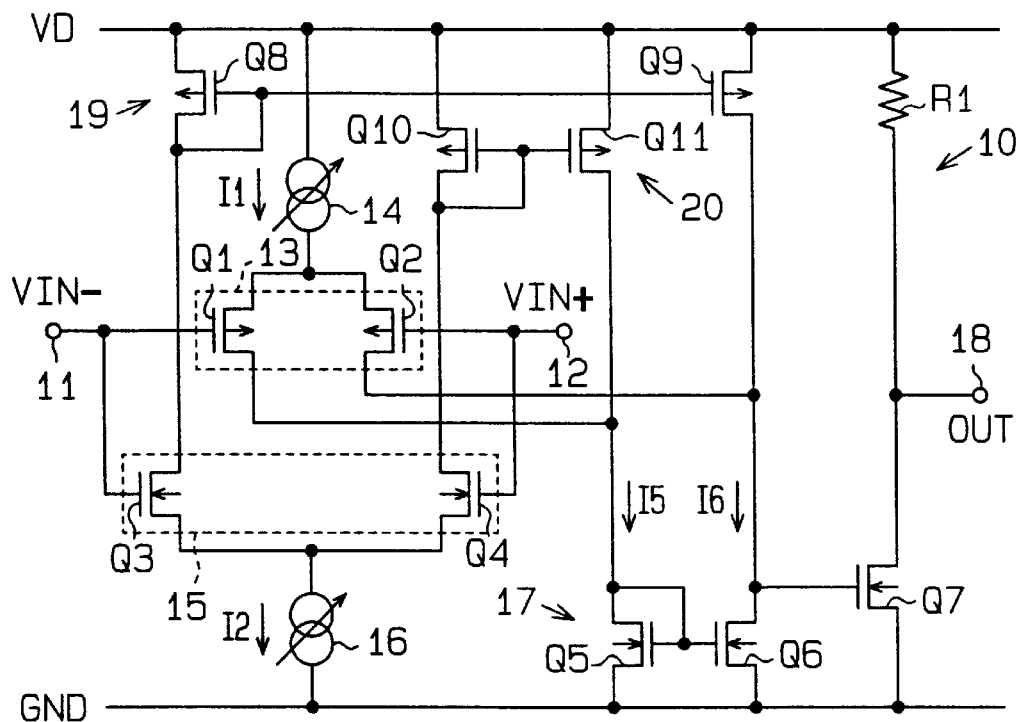
FIG. 1 is a circuit diagram of an operational amplifier circuit according to a first prior art circuit.

Referring now to FIG. 1, a description will be given of how to control the first and second bias currents I31b and I32a of the operational amplifier circuit 340 in the case where the first and second input voltages VIN+ and VIN− of the same phase are supplied. FIG. 10 is a principle diagram for explaining bias current control and shows a current control circuit 370. In FIG. 10, same reference numerals are given to those components which are the same as the corresponding components shown in FIG. 9.

Figure 10:
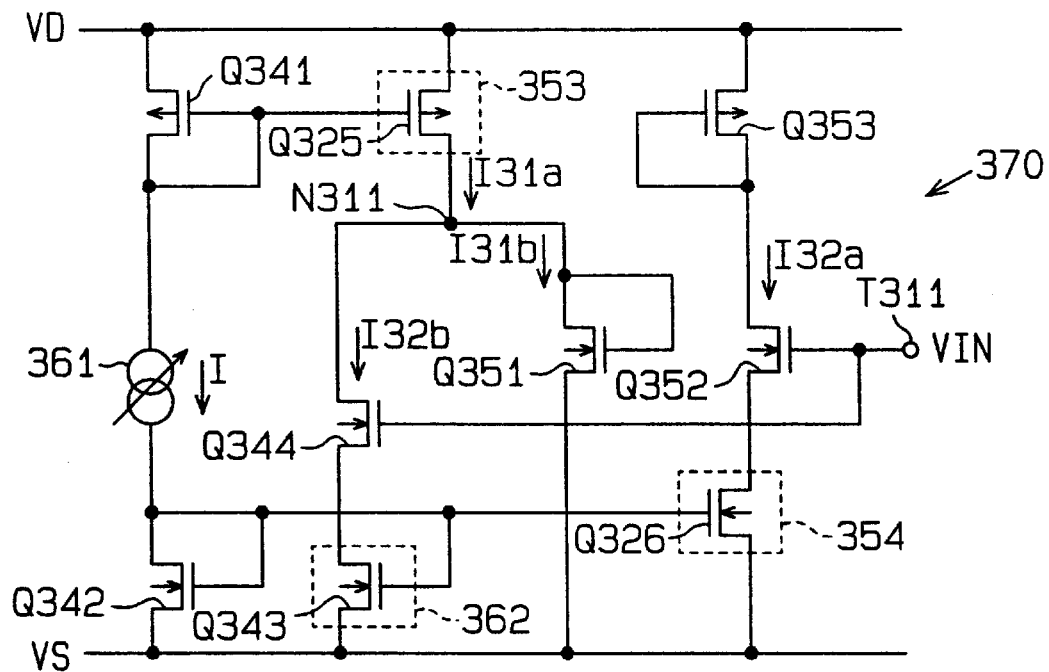
FIG. 10 is a principle diagram for explaining bias current control of the operational amplifier circuit of FIG. 9.

As shown in FIG. 10, an NMOS transistor Q351 is connected between the node N11 and the low-potential power supply VS and the gate of the transistor Q351 is connected to the drain thereof.

An NMOS transistor Q352 is cascade-connected to the transistor Q326. Specifically, the source of the NMOS transistor Q352 is connected to the drain of the transistor Q326 and the input voltage VIN (VIN+, VIN−) is applied to the gate of the transistor Q352. The drain of the transistor Q352 is connected to the high-potential power supply VD via a PMOS transistor Q353. The gate of the transistor Q353 is connected to the drain thereof.

In FIG. 10, the NMOS transistor Q351 corresponds to the first input differential pair 351 of FIG. 9, and the transistor Q352 corresponds to the second input differential pair 352. Therefore, the first bias current I31b flows to the transistor Q351 and the second bias current I32a flows to the transistor Q352.

The transistors Q341 and Q325 form a current mirror circuit, and the current I31a, which is substantially equal to the current I of the constant current source 361, flows to the transistor Q325. The current I31a is constant.

The transistors Q326, Q342 and Q343 form a current mirror circuit and the currents I32a and I32b based on the current I of the constant current source 361 flow to the transistors Q326 and Q343, respectively. The currents I32a and I32b correspond to the gate voltages (i.e., the input voltage VIN) of the transistors Q352 and Q344 respectively cascade-connected to the transistors Q326 and Q343.

When the input voltage VIN is equal to the voltage of the high-potential power supply VD, the current I32a and the current I32b are substantially equal to the current I (I32a=I32b=I). Therefore, the entire current I31a of the transistor Q325 flows to the transistor Q343 and the current I31b that flows to the transistor Q351 becomes 0 (zero).

As the input voltage VIN falls, the source voltage of the transistor Q344 drops too. Because the drain voltage of the transistor Q343 is the same as the source voltage of the transistor Q344, the drain voltage of the transistor Q343 drops in accordance with the falling of the input voltage VIN. When the drain voltage of the transistor Q343 falls to the level that does not permit the same current as the drain current of the transistor Q342 to flow to the transistor Q342, the drain current of the transistor Q343 decreases and the current I32b becomes smaller than the current I (I32b<I). Therefore, the current I32b does not become equal to the constant current I31a (I32b≠I31a) and the current I31b of the transistor Q351 becomes greater than zero (I31b>0).

When the input voltage VIN falls further, the transistor Q343 becomes inoperable and the current I32b becomes zero (I32b=0). At this time, all the current I31a flowing to the transistor Q325 flows to the transistor Q351 so that the current I31b becomes equal to the current I of the constant current source 361 (I31b=I31a=I). Because of the input voltage VIN, the drain voltage of the transistor Q326 becomes substantially equal to the drain voltage of the transistor Q343 and the currents I32a and I32b become substantially equal to each other (I32a=I32b).

When the input voltage VIN becomes equal to the voltage of the low-potential power supply VS, the currents I32a and I32b become zero. Therefore, all the current I31a flowing to the transistor Q325 flows to the transistor Q351 so that the current I31b becomes equal to the current I of the constant current source 361 (I31b=I31a=I).

Figure 11:
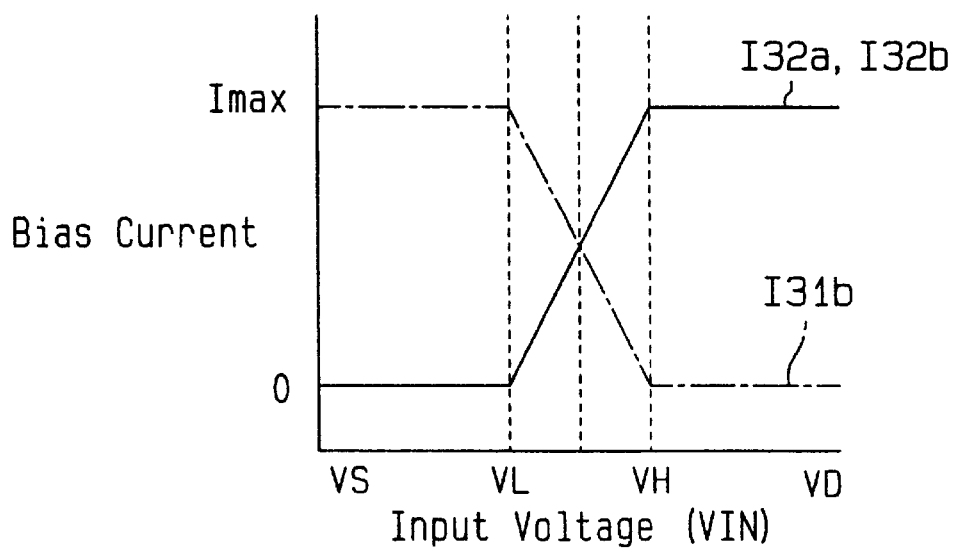
FIG. 11 is a graph showing the relationship between the input voltage and bias current in the operational amplifier circuit of FIG. 9.

When the input voltage VIN has an H level (near the voltage of the high-potential power supply VD), as shown in FIG. 11, I32a=I and I31b=0.

When the input voltage VIN falls and the voltage that is acquired by subtracting the gate-source voltage VGS of the transistors Q344 and Q353 from the input voltage VIN falls below a threshold voltage VH of the transistors Q343 and Q326, I32a<I and I31b>0. The threshold voltage VH is the threshold level at which the transistors Q343 and Q326 can output the current I.

When the input voltage VIN falls further and the subtracted voltage goes below a threshold voltage VL, I32a=0 and I31b=I. The threshold voltage VL is the threshold level at which the transistors Q343 and Q326 can output a current.

The currents I32b and I32a that respectively flow to the transistors Q344 and Q352 change simultaneously in accordance with the gate voltage or the input voltage VIN. Since the current I31a that flows to the transistor Q325 is constant, the current I31b changes at the same time as the currents I32b and I32a. In this case, the amounts of changes (absolute values) in the currents I31b, I32b and I32a are the same.

The threshold voltage VH at which the current I32a starts becoming smaller than the current I is determined by the device sizes of the transistors Q342–Q353 and the process conditions. That is, the threshold voltage VH is not determined when the circuit constant is set but is determined according to the operational points of the transistors Q342–Q353.

The operation of the operational amplifier circuit 340 will be discussed below.

The bias current I that is supplied from the constant current source 361 is supplied to the transistor Q344 and the transistors Q321 and Q322 of the first input differential pair 351 by the current mirror circuit that includes the transistors Q341 and Q325. The current I31a that flows to the transistor Q325 is constant.

The current I is supplied to the transistor Q344 and the transistors Q323 and Q324 of the second input differential pair 352 by the current mirror circuit that is comprised of the transistors Q342, Q343 and Q326.

When the first input voltage VIN+ of an H level is applied to the gate of the transistor Q344, the transistor Q343 mirrors the current of the transistor Q342 so that I32b=I. Since I32b=I31a, the first bias current I31b to the transistors Q321 and Q322 becomes zero (I31b=0).

Since the first input voltage VIN+ falls, the source voltage of the transistor Q344 drops. The source voltage of the transistor Q344 is substantially equal to the drain voltage of the transistor Q343. Therefore, the drain voltage of the transistor Q343 falls too. When the drain voltage of the transistor Q343 falls to the level that does not permit the current that is substantially equal to the drain current of the transistor Q342 to flow to the transistor Q343, the drain current of the transistor Q343 decreases (I32b<I). Therefore, I32b≠I31a and the first bias current I31b to the transistors Q321 and Q322 becomes greater than 0 (I31b>0).

When the first input voltage VIN+falls further, the transistor Q343 becomes inoperable and the current I32b becomes zero (I32b=0). At this time, the first bias current I31b becomes equal to the current I31a (I31b=I31a=I).

The state of the connection of the transistors Q326, Q323 and Q324 is the same as the state of the connection of the transistors Q343 and Q344, and the drain voltage of the transistor Q326 is substantially equal to the drain voltage of the transistor Q343. Thus, the currents I32a and I32b are equal to each other (I32a =I32b).

The operational amplifier circuit 340 of the second embodiment has the following advantages.

(1) The control circuit 343 produces the first bias current I31b by adding the current I32b, which is substantially equal to the second bias current I32a, to the current I31a that flows to the first current source 353. Since the constant current I31a is separated into the current I32b and the first bias current I31b, the current I32b has a negative value with respect to the first bias current I31b from the viewpoint of the calculation. Accordingly, the time at which the first bias current I31b changes becomes substantially the same as the time at which the second bias current I32a changes, so that the amounts of changes (absolute values) in the currents I31b and I32a become substantially the same. The control circuit 343 controls the first and second bias currents I31b and I32a such that the sum of the first and second bias currents I31b and I32a always becomes the constant current I. This control allows the constant currents I331 and I332 to respectively flow to the output-stage transistors Q331 and Q332, regardless of the potential difference between the input voltages VIN+ and VIN−. This prevents the output voltage from varying and improves the common mode rejection ratio.

(2) The control circuit 343 has the transistors Q344 and Q343 that, like the transistors Q323 and Q326, are cascade-connected. The drain of the transistor Q344 is connected to the node between the first current source 353 and the first input differential pair 351. At the node N11, the current I32b, which is substantially equal to the second bias current I32a, is added to the current I31a flowing to the first current source 353. Therefore, the change in the first bias current I31b becomes substantially equal in absolute value to the change in the second bias current I32a. This means that the value (transitional point) of the input voltage VIN+ at which the first and second bias currents I31b and I32a start changing are determined by the electric characteristics of the transistors Q343 and Q344. As a result, even if the electric characteristics of the individual transistors vary depending on the process conditions, the transitional point is changed in accordance with that variation. This prevents the transistors Q321, Q322, Q323 and Q324 of the first and second input differential pairs 351 and 352 from becoming inoperable.

Figure 12:
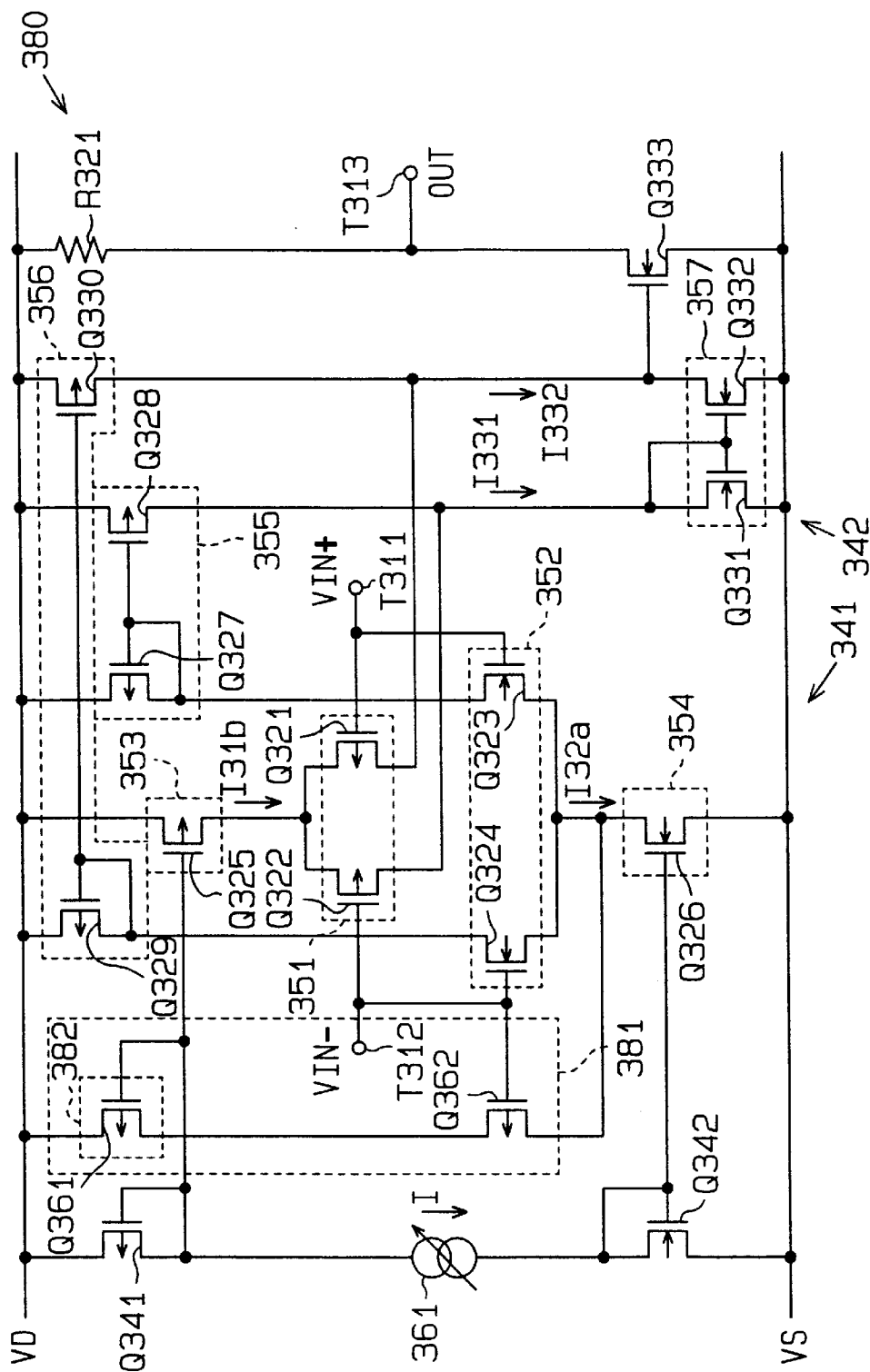
FIG. 12 is a schematic circuit diagram of a modification of the operational amplifier circuit of FIG. 9.

The second embodiment may be modified as follows:

(a) As shown in FIG. 12, the present invention may be embodied in an operational amplifier circuit 380 that includes a control circuit 381 which controls first and second bias currents I31B and I32a in accordance with the second input voltage VIN−.

The control circuit 381 includes a current source 382 including a PMOS transistor Q361, and a PMOS transistor Q362 which has the same polarity as the transistor Q361 and is cascade-connected thereto. The second input voltage VIN− is applied to the gate of the transistor Q362, and controls the saturation/non-saturation of the PMOS transistor Q361. The operational amplifier circuit 380 has an improved common mode rejection ratio and is prevented from becoming inoperable by the process variation.

(b) In the second embodiment, PMOS transistors may be changed to NMOS transistors. In this case, the high-potential power supply VD and the low-potential power supply VS are replaced with each other. Further, the gate voltages of the PMOS transistors cascade-connected to the transistors of the current source that is connected to the high-potential power supply VD are controlled by the first input voltage VIN+ or the gate voltages of the NMOS transistors cascade-connected to the transistors of the current source that is connected to the low-potential power supply VS are controlled by the second input voltage VIN−.

(c) In the second embodiment, all or some of the NMOS transistors may be replaced with NPN bipolar transistors, and all or some of the PMOS transistors may be replaced with PNP bipolar transistors.

A push-pull type operational amplifier circuit 430 according to the third embodiment of the present invention will now be described with reference to FIGS. 13 to 15.

Figure 13:
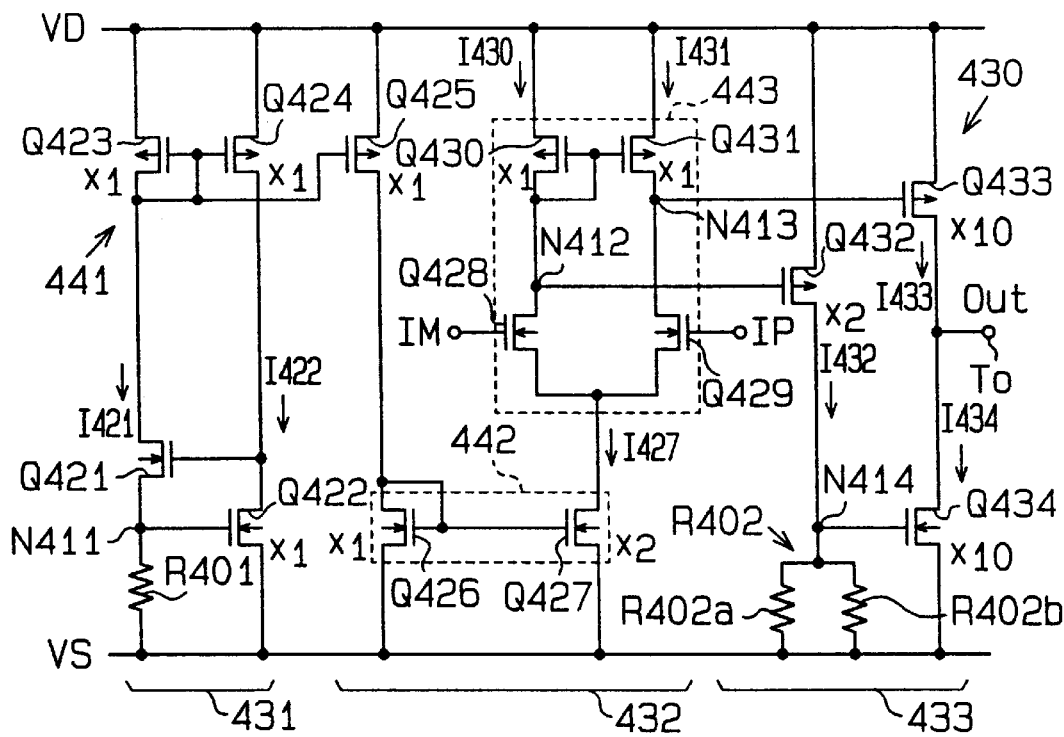
FIG. 13 is a schematic circuit diagram of an operational amplifier circuit according to a third embodiment of the present invention.

As shown in FIG. 13, the operational amplifier circuit 430 has an a constant current source circuit 431, an input stage circuit 432 and an output stage circuit 433.

The constant current source circuit 431 includes a current mirror circuit 441, NMOS transistors Q421 and Q422 and a resistor element R401.

The current mirror circuit 441 includes PMOS transistors Q423 and Q424. The sources of the transistors Q423 and Q424 are connected to a high-potential power supply VD and the drain of the transistor Q423 is connected to the gates of the transistors Q423 and Q424. The drains of the transistors Q423 and Q424 are respectively connected to drains of the transistors Q421 and Q422.

The gate of the transistor Q421 is connected to the drain of the transistor Q422 and the source thereof is connected to the gate of the transistor Q422. The source of the transistor Q421 is connected to a low-potential power supply VS via the resistor element R401, and the source of the transistor Q422 is connected to the low-potential power supply VS.

A node N411 between the transistor Q421 and the resistor element R401 is connected to the gate of the transistor Q422.

The input stage circuit 432 includes a PMOS transistor Q425, a constant current source 442 and a differential input circuit 443.

The source of the PMOS transistor Q425 is connected to the high-potential power supply VD, the gate thereof is connected to the gate of the transistor Q423 of the current mirror circuit 441, and the drain thereof is connected to the constant current source 442. The transistor Q425 has substantially the same size as each of the transistors Q423 and Q424 and supplies substantially the same drain current as the drain current of the transistors Q423 and Q424 (i.e., a drain current I421 of the transistor Q421) to the constant current source 442.

The constant current source 442 includes NMOS transistors Q426 and Q427. The drain of the transistor Q426 is connected to the drain of the transistor Q425. The sources of the transistors Q426 and Q427 are connected to the low-potential power supply VS. The drain of the transistor Q426 is connected to the gates of the transistors Q426 and Q427. The drain of the transistor Q427 is connected to the differential input circuit 443.

The transistor Q427 has double the size of the transistor Q426. Therefore, the constant current source 442 supplies the differential input circuit 443 with a bias current I427, which is double the drain current of the transistor Q425 (i.e., the drain current I421 of the transistor Q421).

The differential input circuit 443 includes a pair of NMOS transistors Q428 and Q429 and a pair of PMOS transistors Q430 and Q431. The sources of the transistors Q428 and Q429 are connected to the drain of the transistor Q427. The drain of the transistor Q428 is connected to the drain of the transistor Q430 and the gates of the transistors Q430 and Q431. The source of the transistor Q430 is connected to the high-potential power supply VD. The drain of the transistor Q429 is connected to the drain of the transistor Q431 the source of which is connected to the high-potential power supply VD.

The transistors Q430 and Q431 have substantially the same sizes. When the voltages of input signals IM and IP are substantially equal to each other, therefore, same drain currents I430 and I431 respectively flow to the transistors Q430 and Q431. Each of the drain currents I430 and I431 is a half of a bias current I427.

The input signals IM and IP are applied to the gates of the transistors Q428 and Q429. The differential input circuit 443 operates on the bias current that is supplied from the transistor Q427 and complimentarily generates a voltage at a node N412 between the transistors Q428 and Q430 and a voltage at a node N413 between the transistors Q429 and Q431 in accordance with the potential difference between the input signals IM and IP.

The nodes N412 and N413 of the differential input circuit 443 are connected to the output stage circuit 433. The output stage circuit 433 includes PMOS transistors Q432 and Q433, an NMOS transistor Q434 and a resistor element R402. The gates of the transistors Q432 and Q433 are respectively connected to the nodes N412 and N413. The node N412 is connected to the drain and gate of the transistor Q430. Therefore, the transistor Q432 is connected to the transistor Q430 in a current mirror fashion.

The source of the transistor Q432 is connected to the high-potential power supply VD and the drain thereof is connected to the resistor element R402. The size of the transistor Q432 is n times the size of the transistor Q430 (or the size of the transistor Q423). (n=2 in the third embodiment.) The transistor Q432 supplies the resistor element R402 with a drain current I432 that is twice as large as the drain current I430 of the transistor Q430.

The source of the upper transistor Q433 at the last output stage is connected to the high-potential power supply VD and the drain thereof is connected to an output terminal To. The size of the transistor Q433 is ten times the size of each of the transistors Q430 and Q431. A drain current I433, which is set in accordance with the ratio of the size of the transistor Q433 to the size of the transistors Q430 and Q431, is output from the output terminal To.

The resistor element R402 includes parallel connected resistor elements R402a and R402b. The resistance of each resistor element R402a, R402b is substantially equal to that of the resistor element R401. The number of resistor elements to be connected in parallel is not limited to two.

A node N414 between the resistor element R402 and the transistor Q432 is connected to the gate of the transistor Q434. The source of the lower transistor Q434 at the last output stage is connected to the low-potential power supply VS and the drain thereof is connected to the output terminal To.

The transistor Q434 pulls a drain current I434 from the output terminal To in accordance with a voltage at the node N414 (gate voltage V434), which is determined by the drain current I432 of the transistor Q432 and the resistance of the resistor element R402.

When the input signals IP and IM are substantially identical, an idling current according to the gate voltage that is set by the resistor element R402 flows in the operational amplifier circuit 430. In the push operation of the operational amplifier circuit 430, the drain current I433 of the transistor Q433 at the last output stage is output from the output terminal To. In the pull operation, the drain current I434 of the transistor Q434 is pulled from the output terminal To.

The operation of the operational amplifier circuit 430 will be described below.

First, a description will be given of how to set the idling current of the output-stage transistor Q434.

Figure 15:
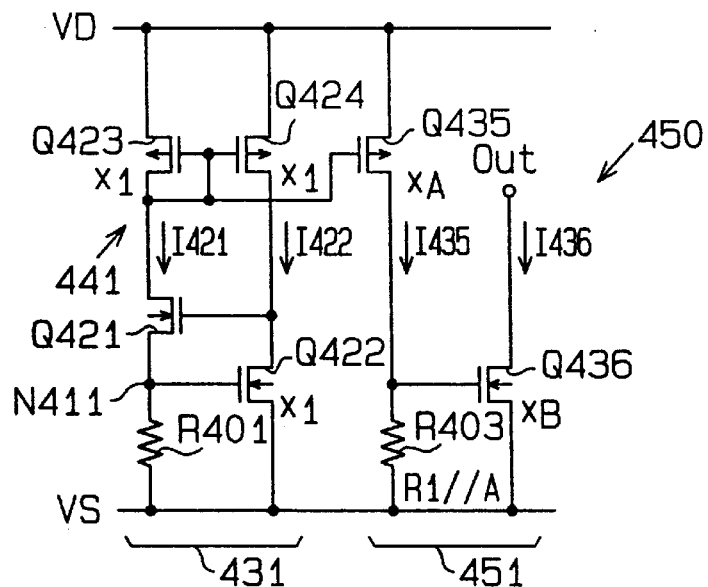
FIG. 15 is a circuit diagram of a current output circuit.

FIG. 15 is a principle diagram for explaining how to set the idling current of the output-stage transistor Q434 and exemplifies a current output circuit 450. In FIG. 15, same reference numerals are given to those components which are the same as the corresponding components shown in FIG. 13.

The current output circuit 450 includes a constant current source circuit 431 and an output stage circuit 451. The output stage circuit 451 includes a PMOS transistor Q435, an NMOS transistor Q436 and a resistor element R403. The transistor Q435 forms a current mirror circuit together with the transistor Q423 of the constant current source circuit 431, and the size of the transistor Q435 is A times the size of the transistor Q423.

The source of the transistor Q435 is connected to the high-potential power supply VD and the drain thereof is connected to the low-potential power supply VS via the resistor element R403. The resistance of the resistor element R403 is obtained by connecting A resistor elements R401 in parallel. The gate of the transistor Q436 is connected to a node between the transistor Q435 and the resistor element R403.

The source of the transistor Q436 is connected to the low-potential power supply VS and the drain thereof is connected to the output terminal To. The size of the transistor Q436 is B times the size of the transistor Q422 of the constant current source circuit 431.

In the constant current source circuit 431, as the transistor Q421 supplies the current to the resistor element R401, the gate voltage of the transistor Q422 (the potential at the node N411) is set. The drain voltage is determined and the gate voltage of the transistor Q421 is set both by the drain current that flows to the transistor Q422. The current mirror circuit 441 controls the drain current to be supplied to the transistor Q422 in accordance with the drain current flowing to the transistor Q421. The transistor Q421 controls the gate voltage of the transistor Q422 such that the drain current of the transistor Q422 becomes substantially equal to the drain current of the transistor Q421.

The drain current I421 of the transistor Q421 and the gate voltage of the transistor Q422 are determined by the size of the transistor Q422 and the resistance of the resistor element R401.

A drain current I435, which is A times the drain current I422 of the transistor Q422, is supplied to the resistor element R403 from the transistor Q435. The resistance of the resistor element R403 is obtained by connecting A resistor elements R401 in parallel. The potential at the node between the transistor Q435 and the resistor element R403 is therefore substantially equal to the potential at the node N411. That is, the gate voltage, V436, of the transistor Q436 is substantially equal to the gate voltage, V422, of the transistor Q422.

The size of the transistor Q436 is B times the size of the transistor Q422, so that the transistor Q436 outputs a drain current I436 that is B times the drain current I422 of the transistor Q422.

The transistor Q432 of FIG. 13 corresponds to the transistor Q435, the size of which is double (A=2) the size of the transistor Q423. The resistor element R402 of FIG. 13 corresponds to the resistor element R403, which has two parallel-connected resistor elements that have substantially the same resistances as the resistance of the resistor element R401. Further, the transistor Q434 of FIG. corresponds to the transistor Q436, the size of which is double (B=2) the size of the transistor Q422.

In FIG. 13, the current I421, which is substantially equal to the drain current I422 of the transistor Q422, is supplied as the bias current I427 to the differential input circuit 443 via the transistors Q425, Q426 and Q427. By setting the size of the transistor Q427, the bias current I427 is as follows.

$$I427 = I421 \times 2 = I422 \times 2$$

When the voltages of the input signals IP and IM are substantially equal to each other, the bias current I427 evenly flows to the transistors Q428 and Q429. Therefore, the drain currents I430 and I431 of the transistors Q430 and Q431 that form a current mirror circuit also become substantially equal to each other. Since the bias current I427 is twice the drain current I422, the drain currents I430 and I431 of the transistors Q430 and Q431 are as follows.

$$I430 = I431 = I422$$

Since the transistor Q432 has double the size of the transistor Q430, the drain current I432 of the transistor Q432 connected to the transistor Q430 in a current mirror fashion becomes:

$$I432 = I430 \times 2 = I422 \times 2$$

The resistor element R402 receives the drain current I432 of the transistor Q432 and sets the gate voltage V434 of the transistor Q434. Since the resistor element R402 includes two parallel-connected resistor elements R402a and R402b, each of which has substantially the same resistance as the resistance of the resistor element R401, the gate voltage V434 is given by:

$$V434 = I432 \times R402$$
$$= (I422 \times 2) \times (R401 \div 2)$$
$$= I422 \times R401$$
$$= V422$$

As apparent from the above, the gate voltage V434 of the transistor Q434 becomes substantially equal to the gate voltage V422 of the transistor Q422.

The drain current I434 of the transistor Q434 (idling current) is determined by the ratio of the size of the transistor Q434 to the size of the transistor Q422 and becomes:

$$I434 = I422 \times 10$$

When the drain current I430 equals the drain current I431, the drain voltage of the transistor Q431 (the voltage at the node N413) is substantially equal to the drain voltage of the transistor Q430 (the voltage at the node N412). Therefore, the drain current I433, according to the size ratio corresponding to the drain current I430, flows to the transistor Q433. When the voltages of the input signals IP and IM are equal, the drain current I430 is equal to the drain current I422. Therefore, the drain current I433 becomes:

$$I433 = I422 \times 10$$

Apparently, when the voltages of the input signals IP and IM are equal, the drain currents I433 and I434, which are identical, flow to the transistors Q433 and Q434.

As the voltage-current conversion is completed by the two stages of transistors Q432 and Q434 in the output stage circuit 433, the operational amplifier circuit 430 operates fast.

When the voltage of the input signal IP is higher than the voltage of the input signal IM, the potential at the node N413 or the gate voltage V433 of the transistor Q433 becomes $$V433 = VS + V(Q427) + V(Q429)$$

where V(Q427) is the saturation voltage (source-drain voltage) of the transistor Q427 and V(Q429) is the saturation voltage of the transistor Q429.

When the voltage of the input signal IP is lower than the voltage of the input signal IM, the gate voltage V433 of the transistor Q433 becomes $$V433 = VD - V(Q431)$$

where V(Q431) is the saturation voltage of the transistor Q431.

Figure 3:
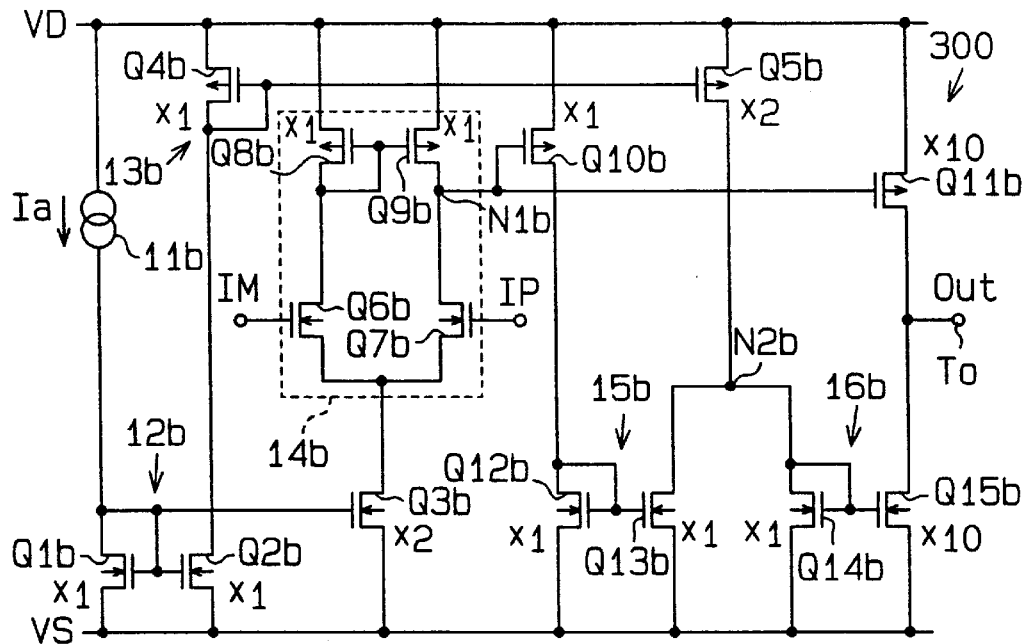
FIG. 3 is a schematic circuit diagram of an operational amplifier circuit according to a second prior art circuit.
Figure 4:
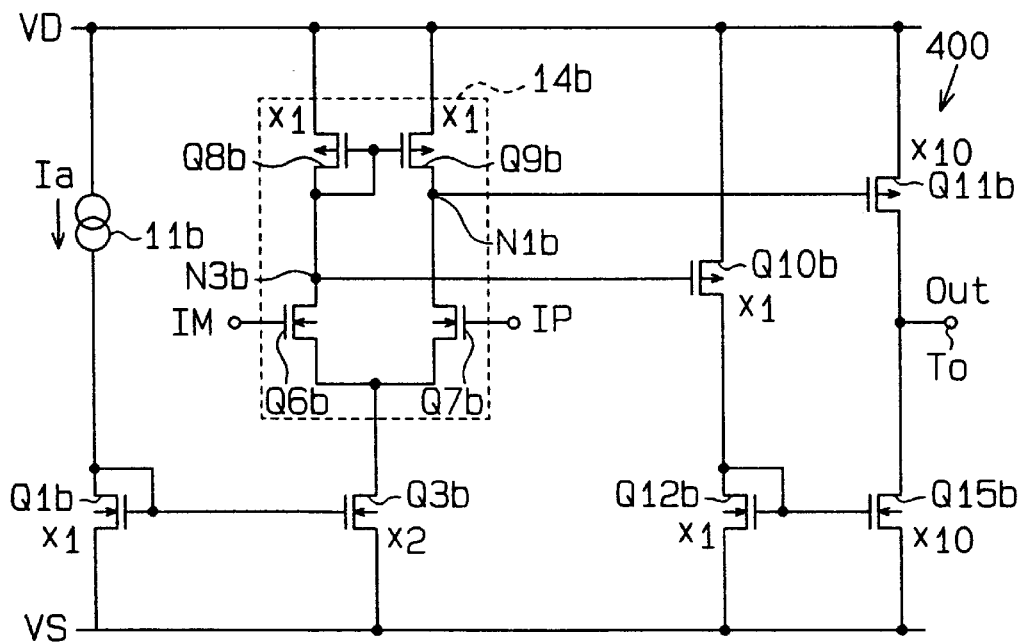
FIG. 4 is a schematic circuit diagram of an operational amplifier circuit according to a third prior art circuit.

The upper output-stage transistor Q433, like those in the prior arts in FIGS. 3 and 4, outputs the drain current I433 in accordance with the gate voltage V433 that rises and falls nearly in the supply voltage range.

When the voltage of the input signal IP is lower than the voltage of the input signal IM, the drain current I430 becomes equal to a maximum bias current I427. Therefore, the drain current I430 of the transistor Q430 becomes:

$$I430 = I427 = I422 \times 2$$

That is, the drain current I430 is twice as large as the drain current that exists when the voltages of the input signals IP and IM are equal to each other. Therefore, at the maximum, the drain current I430, which is double the drain current that exists when the voltages of the input signals IP and IM are equal to each other, flows to the transistor Q432 that is connected to the transistor Q430 in a current mirror fashion. As a result, the voltage V432, which is double the voltage that exists when the voltages of the input signals IP and IM are equal to each other, is applied to the gate (specifically, between the source and gate) of the transistor Q434.

Figure 14:
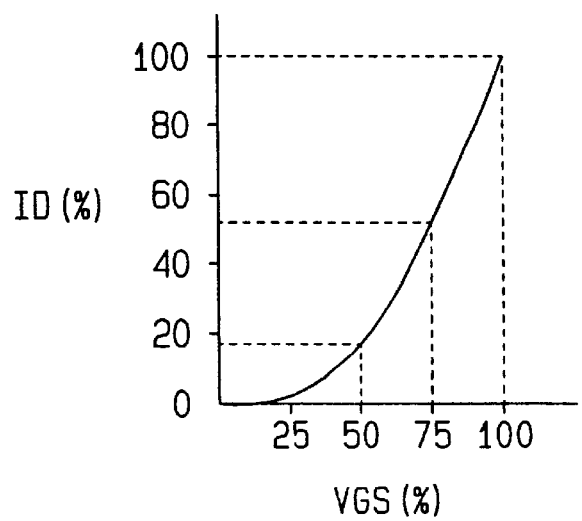
FIG. 14 is a diagram showing the VGS-ID characteristic of an MOS transistor.

As shown in FIG. 14, the source-gate voltage (VGS) v.s. drain current (ID) characteristic of an MOS transistor is expressed by a quadratic curve. Therefore, the drain current I434 that has the quadratic characteristic with respect to the gate voltage V434 flows to the transistor Q434. The source-gate voltage VGS is shown with the source-drain voltage VDS taken as 100%. The drain current ID is shown under the assumption that the drain current produced when the source-gate voltage VGS is equal to the source-drain voltage VDS is 100%.

When the voltages of the input signals IP and IM are identical, for example, the idling current becomes about 17% of the maximum drain current with respect to 50% of the gate voltage V434 (VGS) of the transistor Q434. When the gate voltage V434 is doubled (100%), the drain current I434 of the transistor Q434 becomes 100%, or about six times the idling current that is approximately 17% of the maximum drain current.

Since a lot of drain current I434 flows to the transistor Q434 in the third embodiment, a reduction in the output driving performance of the operational amplifier circuit 430 is suppressed.

The operational amplifier circuit 430 of the third embodiment has the following advantages.

(1) The constant current source circuit 431 has a transistor Q422 with the resistor element R401 connected between its gate and source. The transistors Q421, Q423 and Q424 make the current I421 flowing across the resistor element R401 coincide with the drain current I422 of the transistor Q422. The output-stage transistor Q434 is ten times the size of the transistor Q422. Two resistor elements R402a and R402b, each having substantially the same resistances as the resistance of the resistor element R401, are connected in parallel between the source and gate of the transistor Q434. The drain current I432, which is twice as large as the drain current I422, is supplied to the resistor elements R402a and R402b, thereby setting the gate voltage V434 of the output-stage transistor Q434. That is, the current I432 is produced from the current I421 in accordance with a current ratio expressed by the reciprocal of a ratio of the resistance of the resistor element R401 to the resistance of the second resistor element R402. Because the gate voltage V434 causes the drain current I434, which has the quadratic characteristics, to flow to the transistor Q434, a reduction in the output driving performance of the operational amplifier circuit 430 is suppressed.

(2) The output stage circuit 433 has the transistor Q432, which supplies the drain current I432 to the resistor element R402. The transistor Q432 is connected to the transistor Q430 of the differential input circuit 443 in a current mirror fashion. Therefore, because voltage-current conversion is carried out by the two stages of transistors Q432 and Q434 with the transistor Q430 as a reference, the operational amplifier circuit 430 operates quickly.

In the third embodiment, PMOS transistors may be replaced with NMOS transistors, and NMOS transistors with PMOS transistors. In this case, the high-potential power supply VD should replace the low-potential power supply VS and vise versa.

Figure 16:
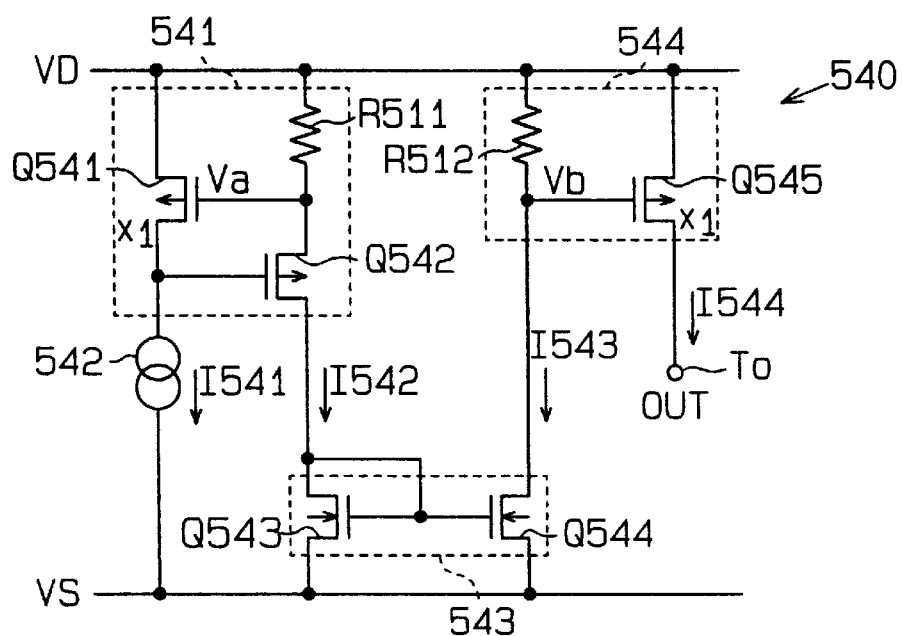
FIG. 16 is a schematic circuit diagram of a current output circuit according to a fourth embodiment of the present invention.

A current output circuit 540 according to the fourth embodiment of the invention will now be described with reference to FIG. 16.

The current output circuit 540 has a current conversion circuit 541, a constant current source circuit 542, a current mirror circuit 543 and an output stage circuit 544.

The current conversion circuit 541 includes PMOS transistors Q541 and Q542 and a first resistor element R511. The source of the first transistor Q541 is connected to a high-potential power supply VD, the gate thereof is connected to the high-potential power supply VD via the first resistor element R511, and the drain thereof is connected to a constant current source 542. The source of the second transistor Q542 is connected to the gate of the first transistor Q541, the gate thereof is connected to the drain of the first transistor Q541, and the drain thereof is connected to the current mirror circuit 543.

The current mirror circuit 543 includes NMOS transistors Q543 and Q544. The drain of the transistor Q543 is connected to the drain of the transistor Q542. The sources of the transistors Q543 and Q544 are connected to a low-potential power supply VS. The drain of the transistor Q543 is connected to the gates of the transistors Q543 and Q544. The drain of the transistor Q544 is connected to the output stage circuit 544.

The size of the transistor Q544 is substantially the same as the size of the transistor Q543. The current mirror operation causes a drain current substantially equal to the drain current of the transistor Q543 (or the drain current I542 of the transistor Q542) to flow to the transistor Q544.

The output stage circuit 544 includes a second resistor element R512 and a PMOS transistor Q545. The drain of the transistor Q544 is connected to the high-potential power supply VD via the second resistor element R512. The source of the transistor Q545 is connected to the high-potential power supply VD, the gate thereof is connected to the high-potential power supply VD via the second resistor element R512, and the drain thereof is connected to an output terminal To.

The size of the transistor Q545 is related to the size of the transistor Q541. In the fourth embodiment, the size of the transistor Q545 is equal to the size of the transistor Q541. The resistance of the second resistor element R512 is related to the resistance of the first resistor element R511. In the fourth embodiment, the resistance of the second resistor element R512 is equal to the resistance of the first resistor element R511.

The operation of the current output circuit 540 will be described below.

While a current I541 is supplied to the transistors Q541 and Q542 and the first resistor element R511 from the constant current source 542, a current I542 is output from the transistor Q542.

The transistor Q542 controls the gate voltage of the transistor Q541 by supplying the current I542 to the first resistor element R511 such that the drain current, which flows to the transistor Q541, is substantially the same as the constant current I541. In other words, the gate-source voltage of the transistor Q541 is set by the first resistor element R511 and the current I542 such that the drain current that flows to the transistor Q541 is substantially the same as the constant current I541.

The current I542 is supplied as a current I543 to the second resistor element R512 via the current mirror circuit 543. Because the sizes of the transistors Q543 and Q544 are identical, the drain current I543, which flows to the transistor Q544, is substantially the same as the drain current I542 of the transistor Q543.

Because the first resistor element R511 is substantially identical to the second resistor element R512, the gate voltage, Va, of the transistor Q541, which is set by the first resistor element R511 and the current I542, is substantially equal to the gate voltage, Vb, of the transistor Q545, which is set by the second resistor element R512 and the current I543.

The transistor Q545 is the same size as the transistor Q541, the sources of the transistors Q545 and Q541 are connected to the high-potential power supply VD, and the gate voltages Vb and Va are equal. Therefore, the drain current I544, which flows to the transistor Q545, is substantially the same as the drain current I541 of the transistor Q541.

When the current I541 of the constant current source circuit 542 is changed, the gate voltage Va of the transistor Q541 is determined by the changed current I541. At this time, the gate voltage Vb, which is substantially equal to the gate voltage Va, is set irrespective of the currents I542 and I543 that respectively flow across the first and second resistor elements R511 and R512. The gate voltage Vb of the transistor Q545 is set by the current/voltage conversion by the second resistor element R512.

In the fourth embodiment, the gate voltages Va and Vb of the transistors Q541 and Q545 are determined spontaneously by the drain current I541 of the transistor Q541. Therefore, the drain current I544 spontaneously flows to the transistor Q545, thus shortening the response time.

The current output circuit 540 of the fourth embodiment has the following advantage.

Figure 5:
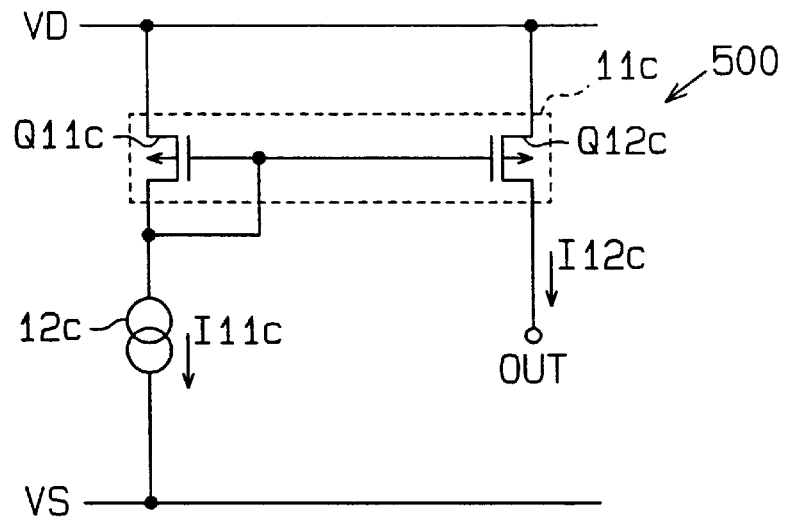
FIG. 5 is a schematic circuit diagram of a current output circuit according to a fourth prior art circuit.

In the current output circuit 540, the gate voltage Vb of the transistor Q545 is set by the current/voltage conversion by the second resistor element R512 whereas, in the conventional current output circuit 500 (see FIG. 5), the gate voltage of the transistor Q512 is set by charging/discharging the capacitor of the transistor Q11c. Because the current output circuit 540 does not set the gate voltage by charging/discharging the capacitor, the current transfer time of the current output circuit 540 is reduced.

Figure 17:
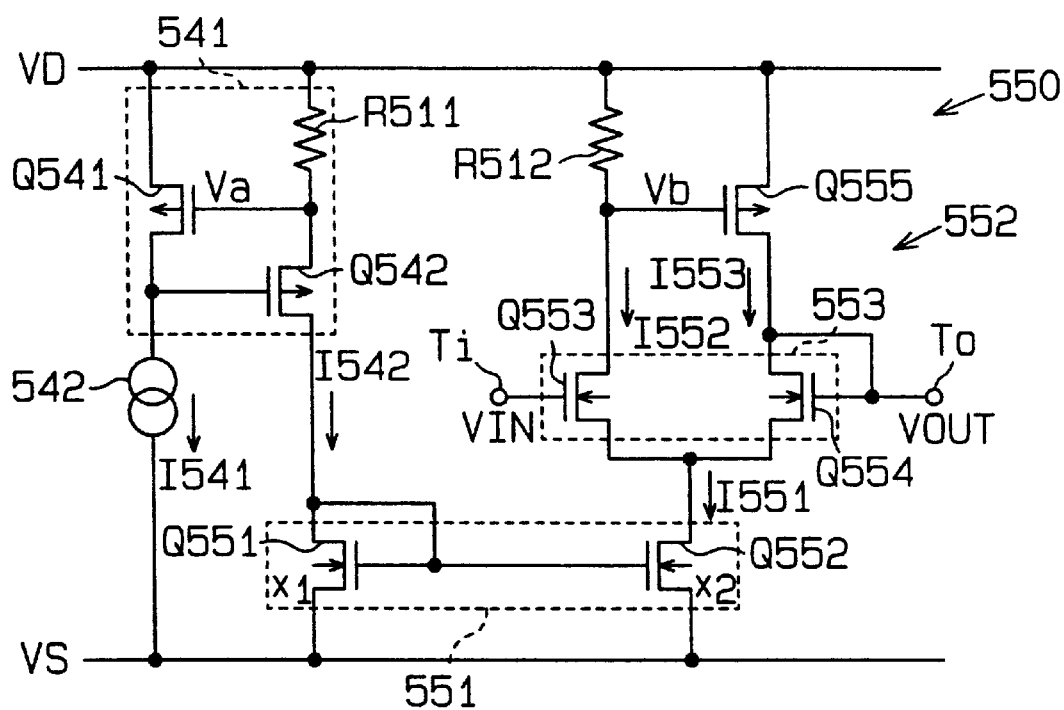
FIG. 17 is a schematic circuit diagram of an analog switch circuit according to a fifth embodiment of the present invention.

An analog switch circuit 550 according to the fifth embodiment of the present invention will now be described with reference to FIG. 17. In FIG. 17, same reference numerals are given to those components which are the same as the corresponding components shown in FIG. 16.

The analog switch circuit 550 has a current conversion circuit 541, a constant current source circuit 542, a current mirror circuit 551 and a differential circuit 552.

The current conversion circuit 541 includes PMOS transistors Q541 and Q542 and a first resistor element R511. A current I541 from the constant current source circuit 542 is supplied to the drain of the transistor Q541. The drain of the transistor Q542 is connected to the current mirror circuit 551.

The current mirror circuit 551 includes NMOS transistors Q551 and Q552. The drain of the transistor Q551 is connected to the drain of the transistor Q542. The sources of the transistors Q551 and Q552 are connected to a low-potential power supply VS. The drain of the transistor Q551 is connected to the gates of the transistors Q551 and Q552. The drain of the transistor Q552 is connected to the differential circuit 552.

The transistor Q552 has a size double the size of the transistor Q551. Accordingly, a drain current twice as large as the drain current of the transistor Q551 (or the drain current of the transistor Q542) is supplied to the differential circuit 552.

The differential circuit 552 includes a differential pair 553 having NMOS transistors Q553 and Q554. The sources of the transistors Q553 and Q554 are connected to the drain of the transistor Q552. The gate of the transistor Q553 is connected to an input terminal Ti, which receives an input signal VIN, and the drain thereof is connected to a high-potential power supply VD via a second resistor element R512. The gate of the transistor Q554 is connected to an output terminal To, and the drain thereof is connected to the output terminal and the drain of a PMOS transistor Q555. The gate of the transistor Q555 is connected to the high-potential power supply VD via the second resistor element R512, and the source thereof is connected to the high-potential power supply VD.

The operation of the analog switch circuit 550 will be described below.

While the external current I541 is supplied to the transistors Q541 and Q542 and the resistor element R511, a current I542 is output from the transistor Q551. The operation of the current mirror circuit 551 causes the drain current of the transistor Q552 to be twice the current I542.

When the external current I541 is substantially equal to the drain current I542, the drain current I551, of the transistor Q552 is twice as large as the external current I541.

When the potential of the input signal VIN is substantially equal to the potential of the output signal VOUT, the differential pair 553 distributes the drain current of the transistor Q552 evenly to the transistors Q553 and Q554. Therefore, the currents I552 and I553, which respectively flow to the transistors Q553 and Q554, are equal to each other.

Since the gate voltage Vb of the transistor Q555 is substantially equal to the gate voltage Va of the transistor Q541, the drain current I553 is equal to the drain currents I541 and I542. Therefore, the drain-in current and source-out current of the transistors Q553 and Q554 match with each other. As a result, the differential pair 553 keeps a stable state where the potential of the input signal VIN is equal to the potential of the output signal VOUT.

When the potential of the input signal VIN is lower than the potential of the output signal VOUT (transient voltage condition), the differential pair 553 works to make the current I552 smaller than the current I553 in response to the input signal VIN. This makes the gate voltage Vb of the transistor Q555 higher than the gate voltage Va of the transistor Q541, so that the drain current I553 becomes smaller than the drain current I541. In this case, the distributed current does not flow to the transistor Q554, thus reducing the gate-source voltage of the transistor Q554. As a result, the potential of the output signal VOUT drops.

When the potential of the input signal VIN is higher than the potential of the output signal VOUT (transient voltage condition), the differential pair 553 works to make the current I552 larger than the current I553. This makes the gate voltage Vb of the transistor Q555 lower than the gate voltage Va of the transistor Q541, so that the drain current I553 becomes larger than the drain current I541. In this case, the distributed current does not flow to the transistor Q553, thus reducing the gate-source voltage of the transistor Q553. This raises the potential of the output signal VOUT.

Figure 6:
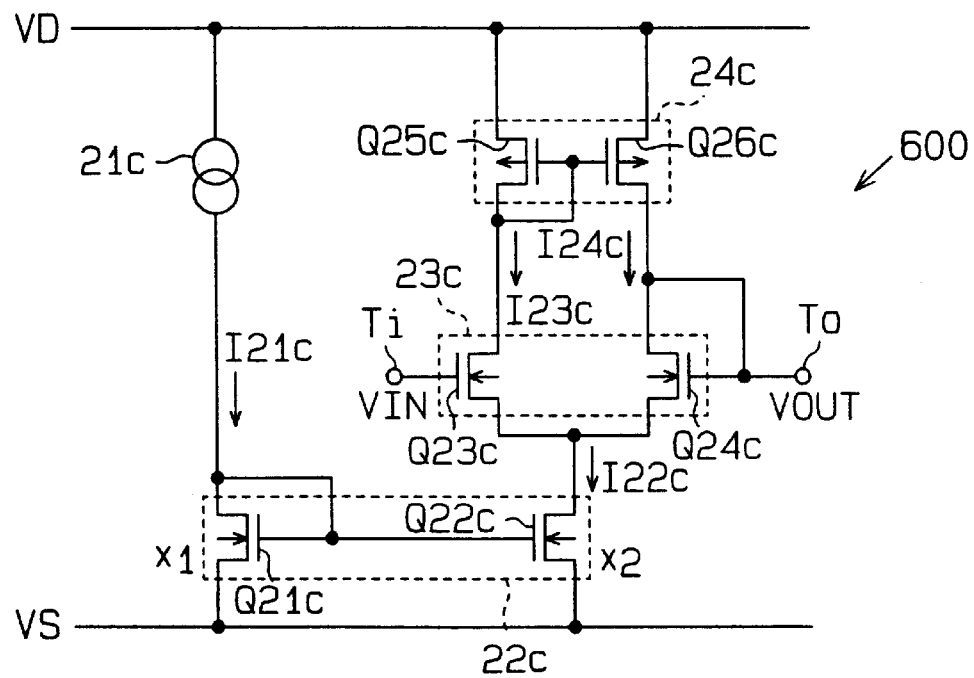
FIG. 6 is a schematic circuit diagram of an analog switch circuit according to a fifth prior art circuit.

In the analog switch circuit 550 of the fifth embodiment, the gate voltage Vb of the transistor Q555 is set by the current/voltage conversion of the current I552 by the second resistor element R512, thus changing the current I553. As a result, the time of producing the current I553 becomes shorter than that in the current mirror circuit 524 of FIG. 6. The analog switch circuit 550 therefore operates quickly.

Figure 18:
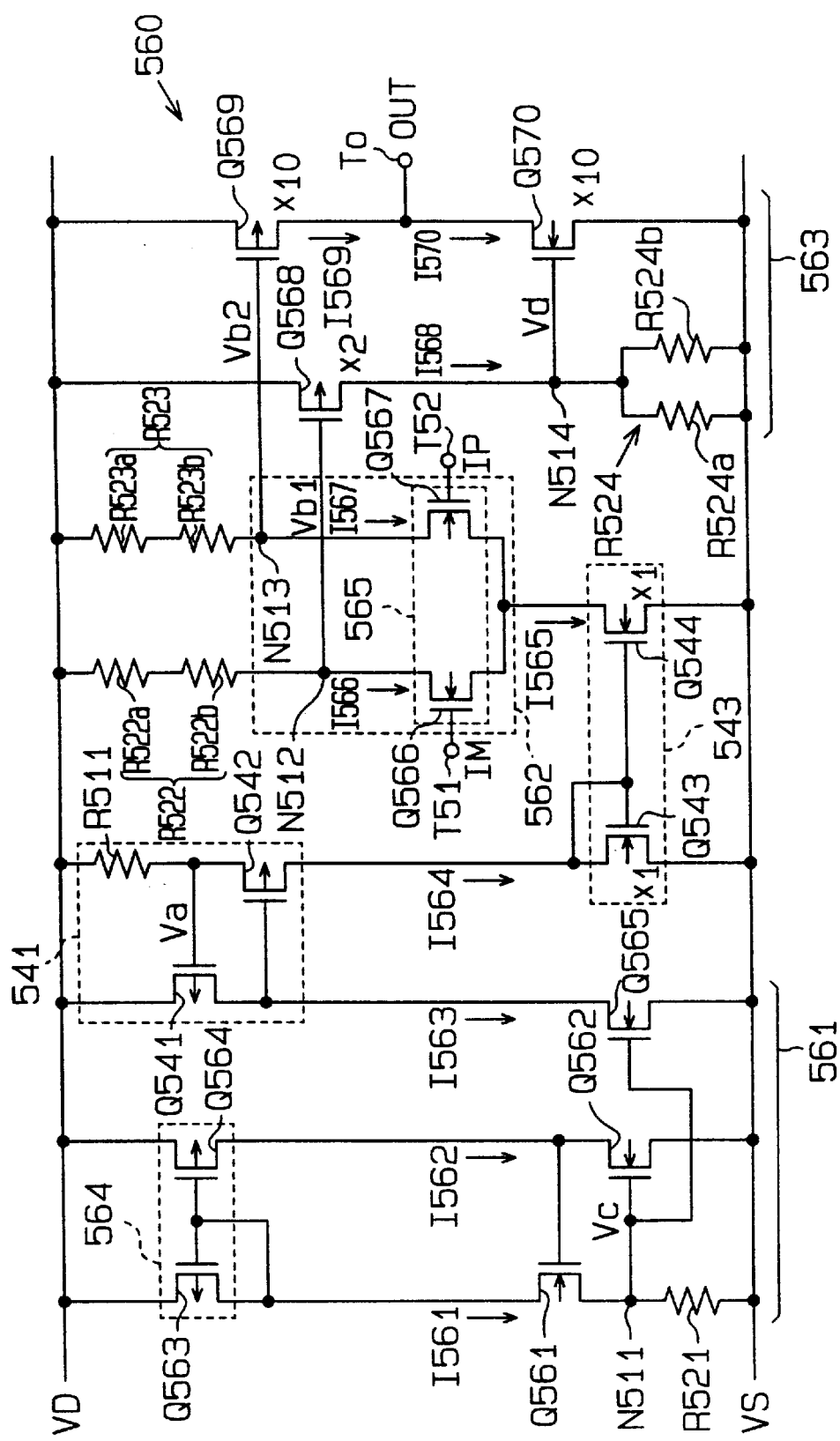
FIG. 18 is a schematic circuit diagram of an operational amplifier circuit according to a sixth embodiment of the present invention.

A push-pull type operational amplifier circuit 560 according to the sixth embodiment of the invention will now be described with reference to FIG. 18. In FIG. 18, same reference numerals are given to those components that are the same as the corresponding components shown in FIGS. 16 and 17.

The operational amplifier circuit 560 includes a constant current source circuit 561, a current conversion circuit 541, a current mirror circuit 543, a differential input circuit 562 and an output stage circuit 563.

The constant current source circuit 561 includes a current mirror circuit 564, NMOS transistors Q561 and Q562 and a first resistor element R521.

The current mirror circuit 564 includes PMOS transistors Q563 and Q564. The sources of the transistors Q563 and Q564 are connected to a high-potential power supply VD. The drain of the transistor Q563 is connected to the gates of the transistors Q563 and Q564. The drains of the transistors Q563 and Q564 are respectively connected to the drains of the transistors Q561 and Q562.

The gate of the transistor Q516 is connected to the drain of the transistor Q562, and the source thereof is connected to a low-potential power supply VS via the resistor element R521. A node N11 between the transistor Q561 and the resistor element R521 is connected to the gate of the transistor Q562, and the source of the transistor Q562 is connected to the low-potential power supply VS.

The source of the transistor Q565 is connected to the low-potential power supply VS, the gate thereof is connected to the gate of the transistor Q562, and the drain thereof is connected to the current conversion circuit 541. The size of the transistor Q565 is substantially equal to the size of the transistor Q562, so that a drain current I563 that is substantially equal to the drain current I562 (I561) of the transistor Q562 is supplied to the current conversion circuit 541 from the transistor Q565.

When the transistor Q561 supplies the current to the first resistor element R521, the gate voltage Vc of the transistor Q562 is set. The drain voltage of the transistor Q562 is determined by the drain current I562 flowing to the transistor Q562, thereby setting the gate voltage of the transistor Q561.

The current mirror circuit 564 receives the drain current I561 from the transistor Q561 and controls the drain current to be supplied to the transistor Q562. The current I561 and the resistor element R521 determine the gate-source voltage of the transistor Q562, which causes the drain current I562 to flow to the transistor Q562. That is, the transistor Q561 controls the gate voltage of the transistor Q562 such that the drain current I562, which flows to the transistor Q562, is substantially equal to the drain current I561.

The drain current I561 of the transistor Q561 and the gate voltage Vc of the transistor Q562 are determined by the size of the transistor Q562 and the resistance of the resistor element R521.

The current conversion circuit 541 includes PMOS transistors Q541 and Q542 and a second resistor element R511. The drain of the transistor Q541 is connected to the drain of the transistor Q565 and a drain current I564 is output from the transistor Q542. The gate-source voltage of the transistor Q541 is determined by the current I564 and the second resistor element R511, and the drain current, which flows to the transistor Q541, is substantially equal to the current I563.

The current mirror circuit 543 includes NMOS transistors Q543 and Q544. The drain of the transistor Q543 is connected to the drain of the transistor Q542. The sources of the transistors Q543 and Q544 are connected to the low-potential power supply VS, and the drain of the transistor Q543 is connected to the gates of the transistors Q543 and Q544.

The size of the transistor Q544 is substantially equal to the size of the transistor Q543. The transistor Q544 supplies the differential input circuit 562 with substantially the same bias current as the drain current I563 of the transistor Q543.

The differential input circuit 562 includes a differential pair 565 having NMOS transistors Q566 and Q567 and third and fourth resistor elements R522 and R523. The sources of the transistors Q566 and Q567 are connected to the drain of the transistor Q544.

The drain of the transistor Q566 is connected to the high-potential power supply VD via the third resistor element R522. The drain of the transistor Q567 is connected to the high-potential power supply VD via the fourth resistor element R523. The gate of the transistor Q566 is connected to a first input terminal T1 and the gate of the transistor Q567 is connected to a second input terminal T2.

The third resistor element R522 includes plural (two in the sixth embodiment) resistor elements R522a and R522b connected in series. The resistance of each of the resistor elements R522a and R522b is substantially equal to the resistance of the second resistor element R511. The fourth resistor element R523 includes two resistor elements R523a and R523b connected in series. The resistance of each of the resistor elements R523a and R523b is substantially equal to the resistance of the second resistor element R511. Therefore, the resistance of each of the third and fourth resistor elements R522 and R523 is twice the resistance of the second resistor element R511. That is, the resistances of the third and fourth resistor elements R522 and R523 are related to the resistance of the second resistor element R511.

The transistors Q566 and Q567 have the same size. The differential input circuit 562 receives a bias current I565 from the transistor Q544 and produces drain currents I566 and I567 in accordance with the potential difference between the first and second input signals IM and IP. The drain currents I566 and I567 complimentarily change the potential at a node N12 between the transistor Q566 and the third resistor element R522 and the potential at a node N13 between the transistor Q567 and the fourth resistor element R523. When the potentials of the first and second input signals IM and IP are equal, the drain currents I566 and I567 that flow to the transistors Q566 and Q567, respectively, are identical.

The output stage circuit 563 includes PMOS transistors Q568 and Q569, an NMOS transistor Q570 and a fifth resistor element R524. The gate of the transistor Q568 is connected to the node N12, and gate of the transistor Q569 is connected to the node N13.

The source of the transistor Q568 is connected to the high-potential power supply VD, and the drain thereof is connected to the fifth resistor element R524. The transistor Q568 is n times the size of the transistor Q541 (n=2 in the sixth embodiment), and the transistor Q568 produces a drain current I568 in response to a gate voltage Vb1.

The source of the upper transistor Q569 at the last output stage is connected to the high-potential power supply VD, and the drain thereof is connected to an output terminal To. The transistor Q569 is ten times the size of the transistor Q541. The transistor Q569 supplies a drain current I569 to the output terminal To in response to a gate voltage Vb2.

The fifth resistor element R524 includes parallel-connected n (two in the sixth embodiment) resistor elements R524a and R524b. Each of resistor elements R524a and R524b has a resistance that is substantially equal to the resistance of the first resistor element R521. Therefore, the resistance of the fifth resistor element R524 is half the resistance of the first resistor element R521. That is, the resistance of the fifth resistor element R524 is related to the resistance of the first resistor element R521.

A node N14 between the fifth resistor element R524 and the transistor Q568 is connected to the gate of the lower transistor Q570 at the last output stage. The source of the transistor Q570 is connected to the low-potential power supply VS, and the drain thereof is connected to the output terminal To.

The transistor Q570 is ten times the size of the transistor Q562. The transistor Q570 produces a drain current I570 that is pulled from the output terminal To in response to a gate voltage Vd (the potential at the node N14) determined by the drain current I568 of the transistor Q568 and the resistance of the resistor element R524.

The operational amplifier circuit 570 performs the push-pull operation in accordance with the potentials of the input signals IP and IM, so that the drain current I569 of the transistor Q569 is output from the output terminal To or the drain current I570 of the transistor Q570 is pulled from the output terminal To.

The operation of the operational amplifier circuit 560 will be described below.

The transistors Q561 to Q564 and the first resistor element R521 produce a drain current I562 of the transistor Q562 that is substantially equal to the drain current I561 of the transistor Q561. The transistor Q565 produces a drain current I563 that is substantially equal to the drain current I562 of the transistor Q562.

The transistors Q541 and Q542 and the resistor element R511 convert the current I563 to the current I564. The current I564 and the resistor element R511 determine the gate-source voltage of the transistor Q541, which causes the drain current I563 to flow to the transistor Q541.

The current mirror circuit 543 supplies the differential pair 565 with the bias current I565 which is substantially equal to the current I564.

A description will now be given of the operation of the current mirror circuit 543 having the voltage follower connection in which the first input terminal T1 is connected to the output terminal To.

(1) Case where the potentials of the first and second input signals IM and IP are equal to each other:

The transistors Q566 and Q567 operate to evenly distribute the bias current I565 to the transistors Q566 and Q567. This makes the drain currents I567 and I568 equal. Each drain current is half of the current I564 (I566=I567=I564×0.5)

The gate voltage Vb1 of the transistor Q568 is given as follows from the resistance of the third resistor element R522 and the current I566.

$$Vb1 = I566 \times R522 = I564 \times 0.5 \times R511 \times 2 = Va$$

That is, the gate voltage Vb1 of the transistor Q568 is substantially equal to the gate voltage Va of the transistor Q541.

The gate voltage Vb2 of the transistor Q569 is given by:

$$Vb2 = I567 \times R523 = I564 \times 0.5 \times R511 \times 2 = Va$$

That is, the gate voltage Vb2 is substantially equal to the gate voltage Va of the transistor Q541.

The transistor Q569 produces the current I569, which is ten times the drain current I563 of the transistor Q541, in response to the gate voltage Vb2.

The transistor Q568 supplies the fifth resistor element R524 with the current I568, which is twice as large as the drain current I563 (I562), in response to the gate voltage Vb1.

The gate voltage Vd of the transistor Q570 is given as follows from the resistance of the fifth resistor element R524 and the current I568.

$$Vd = I568 \times R524 = I562 \times 2 \times R521 \div 2 = Vc$$

Thus, the gate voltage Vd is substantially equal to the gate voltage Vc of the transistor Q562.

The drain current I570, which is ten times the drain current I562, flows to the transistor Q570.

Because the drain current I569 of the transistor Q569 is substantially equal to the drain current I570 of the transistor Q570, the stable state, where the potentials of the first and second input signals IM and IP are equal is maintained.

(2) Case where the potential of the second input signal IP is lower than the potential of the first input signal IM (the potential of the output signal OUT):

The differential pair 565 distributes much of the bias current I565 to the transistor Q566 (I566 >I567). The drain current I566 of the transistor Q566 therefore becomes larger than half the drain current I564 of the transistor Q542 (I566>I564×0.5).

Due to the third resistor element R522, the gate voltage Vb1 of the transistor Q568 becomes:

$$Vb1 = I566 \times R522 < Va$$

The gate voltage Vb1 is lower than the gate voltage Va of the transistor Q541.

The gate voltage Vb2 of the transistor Q569 becomes:

$$Vb2 = I567 \times R523 > Va$$

The gate voltage Vb2 is higher than the gate voltage Va of the transistor Q541.

The transistor Q569 produces the current I569 (I569≦I563×10), which is equal to or lower than ten times the drain current I563, in response to the gate voltage Vb2.

The transistor Q568 supplies the fifth resistor element R524 with the current I568 (I568≧I563×2), which is equal to or larger than two times the drain current I563, in response to the gate voltage Vb1.

Because the resistance of the fifth resistor element R524 is half the resistance of the first resistor element R521, the gate voltage Vd of the transistor Q570 becomes:

$$Vd > Vc$$

The gate voltage Vd is thus higher than the gate voltage Vc of the transistor Q562.

The transistor Q570 produces the current I570, which is equal to or greater than ten times the drain current I562 (I570≧I562×10), in response to the gate voltage Vd (Vd>Vc). Therefore, the drain current I569 becomes smaller than the drain current I570. As a result, the potential of the output signal OUT falls to near the potential of the low-potential power supply VS, thus reducing the terminal voltage of the first input signal IM.

(3) Case where the potential of the second input signal IP is higher than the potential of the first input signal IM (the potential of the output signal OUT):

The differential pair 565 distributes much of the bias current I565 to the transistor Q567 (I566<I567). The drain current I566 therefore becomes smaller than half the drain current I564 (I566<I564×0.5).

Due to the third resistor element R522, the gate voltage Vb1 of the transistor Q568 becomes:

$Vb1 = I566 \times R522 > Va$

The gate voltage Vb1 is higher than the gate voltage Va of the transistor Q541.

The gate voltage Vb2 of the transistor Q569 becomes:

$Vb2 = I567 \times R523 < Va$

The gate voltage Vb2 is lower than the gate voltage Va of the transistor Q541.

The transistor Q569 produces the drain current I569 (I569≧I563×10), which is equal to or larger than ten times the drain current I563, in response to the gate voltage Vb2.

The transistor Q568 supplies the fifth resistor element R524 with the current I568 (I568≦I563×2), which is equal to or smaller than two times the drain current I563, in response to the gate voltage Vb1.

Because the resistance of the fifth resistor element R524 is half the resistance of the first resistor element R521, the gate voltage Vd of the transistor Q570 becomes:

$Vd < Vc$

The gate voltage Vd thus becomes lower than the gate voltage Vc of the transistor Q562.

The transistor Q570 produces the current I570, which is equal to or smaller than ten times the drain current I562 (I570≦I562×10), in response to the gate voltage Vd. Therefore, the drain current I569 becomes larger than the drain current I570. As a result, the potential of the output signal OUT rises to near the potential of the high-potential power supply VD, thus raising the terminal voltage of the first input signal IM.

The operational amplifier circuit 560 of the sixth embodiment has the following advantages.

(1) The gate voltages Vb1 and Vb2 of the transistor Q568 and the output transistor Q569 are respectively set by the third and fourth resistor elements R522 and R523, and the currents I568 and I569, which correlate with the drain current I563 of the transistor Q541, are produced accordingly. The current/voltage conversion by the third and fourth resistor elements R522 and R523 change the gate voltages Vb1 and Vb2 in accordance with the first and second input signals IM and IP. This causes the drain current I569 of the first output transistor Q569, the drain current I568 of the transistor Q568 and the drain current of the second output transistor Q570 to vary. As a result, the currents I569 and I570 vary quickly in accordance with changes in the first and second input signals IM and IP, thus shortening the current transfer time. The operational amplifier circuit 560 therefore operates quickly.

(2) The transistors Q561, Q563 and Q564 make the current I561 flowing across the resistor element R521 equal to the drain current I562 of the transistor Q562. The current I568, which is twice the drain current I562, is supplied to the resistor element R524, and the gate voltage Vd of the output transistor Q570 is set accordingly. Therefore, the transistor Q570 demonstrates a response according to a quadratic characteristic with respect to the gate voltage Vc, thus preventing the output driving performance of the operational amplifier circuit 570 from deteriorating.

(3) The gate of the transistor Q568 is connected to the drain of the transistor Q566 of the differential pair 565. Therefore, the two stages of transistors Q568 and Q570 perform voltage-current conversion with the differential pair 565 as a reference. The operational amplifier circuit 570 therefore operates quickly.

The fourth to sixth embodiments may be modified as follows:

(a) PMOS transistors may be replaced with NMOS transistors, and NMOS transistors with PMOS transistors. In this case, the high-potential power supply VD should replace the low-potential power supply VS and vice versa.

(b) In the operational amplifier circuit 560, for example, the ratio of the resistance of the first resistor element R521 to the resistance of the fifth resistor element R524 may be changed as needed. In this case, the gate voltage Vd of the output transistor Q570 should be substantially equal to the gate voltage Vc of the transistor Q562. Further, it is preferable to change the drain current I568 by altering the size of the transistor Q568.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. An operational amplifier circuit comprising:
   a first differential pair including a first transistor responsive to a first input voltage and a second transistor responsive to a second input voltage;
   a second differential pair including a third transistor responsive to the first input voltage and a fourth transistor responsive to the second input voltage;
   a fifth transistor connected to the first and third transistors;
   a sixth transistor connected to the second and fourth transistors;
   a first current source, which is connected to the first differential pair, for supplying a first bias current to the first differential pair;
   a second current source, which is connected to the second differential pair, for supplying a second bias current to the second differential pair;
   a third current source, which is connected to the fifth transistor, for supplying a third bias current to the fifth transistor;
   a fourth current source, which is connected to the sixth transistor, for supplying a fourth bias current to the sixth transistor; and
   a control circuit, which is connected to the first to fourth current sources, for receiving the first and second input voltages and controlling the first to fourth current sources such that the sum of the first and second bias currents is constant and the second to fourth bias currents become substantially equal.

2. The operational amplifier circuit according to claim 1, wherein the control circuit includes:
   a constant current source for producing a constant current that is equal to the sum of the first and second bias currents; and
   a distribution circuit, which is connected to the first to fourth current sources, for comparing the first and second input voltages with a reference voltage and distributing the constant current of the constant current source to the first bias current of the first current source and the second to fourth bias currents of the second to fourth current sources based on a comparison result.

3. The operational amplifier circuit according to claim 1, wherein the first and third transistors are connected to each other, the fifth transistor is connected to a node between the first and third transistors, the second and fourth transistors are connected to each other, and the sixth transistor is connected to a node between the second and fourth transistors.

4. The operational amplifier circuit according to claim 3, wherein each of the first and second transistors is a P channel transistor and each of the third to sixth transistors is an N channel transistor.

5. The operational amplifier circuit according to claim 4, wherein each of the first, third and fourth current sources includes a P channel transistor and the second current source includes an N channel transistor.

6. A method of controlling first and second bias currents respectively supplied to first and second differential pairs of an operational amplifier circuit, comprising:
controlling the second bias current in accordance with one of first and second input voltages; and
controlling the first bias current using a predetermined constant current and a current substantially equal to the second bias current so that the first bias current changes at the same time as the second bias current.

7. The method according to claim 6, wherein the step of controlling the first bias current includes producing the first bias current by adding the predetermined constant current to the current that is substantially equal to the second bias current.

8. The method according to claim 6, wherein the sum of the first and second bias currents is equal to the predetermined constant current.

9. An operational amplifier circuit comprising:
a first differential pair for receiving a first bias current and operating in response to first and second input voltages;
a second differential pair for receiving a second bias current and operating in response to the first and second input voltages;
a first current source connected to the first differential pair;
a second current source, which is connected to the second differential pair, for producing the second bias current; and
a control circuit, which is connected to the first and second current sources, for controlling the first current source such that the first current source produces a constant current, wherein the control circuit produces the first bias current at a node between the first differential pair and the first current source by adding a current that is substantially equal to the second bias current to the constant current in accordance with one of the first and second input voltages.

10. The operational amplifier circuit according to claim 9, wherein the control circuit includes:
a third current source connected to the second current source, wherein the third current source includes a first transistor for producing a current substantially equal to the second bias current; and
a second transistor, which is connected to the third current source and which has the same polarity as that of the first transistor, for controlling a current passing the first transistor in accordance with one of the first and second input voltages.

11. The operational amplifier circuit according to claim 9, wherein the control circuit includes:
a constant current source for producing a constant current that is a sum of the first and second bias currents;
a first transistor connected between the constant current source and a first power supply and connected to the first current source in a current mirror manner;
a second transistor connected between the constant current source and a second power supply and connected to the second current source in a current mirror manner;
a third transistor, which is connected to the second transistor in a current mirror manner, for producing a current substantially equal to the second bias current; and
a fourth transistor cascade-connected to the third transistor, wherein the drain of the fourth transistor is connected to the node between the first differential pair and the first current source, and the gate of the fourth transistor receives one of the first and second input voltages.

12. The operational amplifier circuit according to claim 9, further comprising:
a current mirror circuit connected to the first and second differential pairs; and
an output transistor, the gate of which is connected to the current mirror circuit, the drain of which is connected to a first power supply, and the source of which is connected to a second power supply.

13. An operational amplifier circuit comprising:
a first differential pair including a first P channel transistor responsive to a first input voltage and a second P channel transistor responsive to a second input voltage, wherein the first differential pair receives a first bias current;
a second differential pair including a first N channel transistor responsive to the first input voltage and a second N channel transistor responsive to the second input voltage, wherein the second differential pair receives a second bias current;
a first current source including a third P channel transistor connected between the first differential pair and a high-potential power supply;
a second current source, which includes a third N channel transistor connected between the second differential pair and a low-potential power supply, for producing the second bias current; and
a control circuit for controlling the first current source such that the first current source produces a predetermined constant current and for controlling the first and second bias currents, the control circuit including:
a third current source connected to the second current source, wherein the third current source includes a fourth N channel transistor that produces a current substantially equal to the second bias current; and
a fifth N channel transistor connected to the fourth N channel transistor and a node between the first current source and the first differential pair, wherein the fifth N channel transistor is responsive to one of the first and second input voltages.

14. An operational amplifier circuit comprising:
a first differential pair including a first P channel transistor responsive to a first input voltage and a second P channel transistor responsive to a second input voltage, wherein the first differential pair receives a first bias current;

a second differential pair including a first N channel transistor responsive to the first input voltage and a second N channel transistor responsive to the second input voltage, wherein the second differential pair receives a second bias current;

a first current source including a third P channel transistor connected between the first differential pair and a high-potential power supply;

a second current source, which includes a third N channel transistor connected between the second differential pair and a low-potential power supply, for producing the second bias current; and a control circuit for controlling the second current source such that the second current source produces a predetermined constant current and for controlling the first and second bias currents, the control circuit including:
  a third current source connected to the first current source, wherein the third current source includes a fourth P channel transistor that produces a current substantially equal to the first bias current; and
  a fifth P channel transistor connected to the fourth P channel transistor and a node between the second current source and the second differential pair, wherein the fifth P channel transistor is responsive to one of the first and second input voltages.

15. A control circuit, which is connected to a first power supply, for controlling a first output current flowing in a first current source including a first transistor cascade-connected to a second transistor that has the same polarity as that of the first transistor, the control circuit comprising:

a second current source connected to the first power supply, wherein the second current source includes a third transistor, and wherein a second output current that is substantially equal to the first output current flows to the second current source;

a fourth transistor cascade-connected to the third transistor, wherein the fourth transistor has the same polarity as that of the third transistor, and the second and fourth transistors control the first and second output currents by controlling saturation/non-saturation of the first and third transistors in accordance with a voltage signal; and a third current source, which is connected to the second power supply, for producing a third output current, wherein a fourth output current, the phase of which is opposite to that of the first output current, is produced by adding the second output current and the third output current.

16. A semiconductor device including an operational amplifier circuit, wherein the operational amplifier circuit comprises:

a first differential pair for receiving a first bias current and operating in response to first and second input voltages;

a second differential pair for receiving a second bias current and operating in response to the first and second input voltages;

a first current source connected to the first differential pair;

a second current source, which is connected to the second differential pair, for producing the second bias current; and a control circuit, which is connected to the first and second current sources, for controlling the first current source such that the first current source produces a constant current, wherein the control circuit produces the first bias current at a node between the first differential pair and the first current source by adding a current substantially equal to the second bias current to the constant current in accordance with one of the first and second input voltages.

17. A semiconductor device including an operational amplifier circuit, wherein the operational amplifier comprises:

a first differential pair including a first P channel transistor responsive to a first input voltage and a second P channel transistor responsive to a second input voltage, wherein the first differential pair receives a first bias current;

a second differential pair including a first N channel transistor responsive to the first input voltage and a second N channel transistor responsive to the second input voltage, wherein the second differential pair receives a second bias current;

a first current source including a third P channel transistor connected between the first differential pair and a high-potential power supply;

a second current source, including a third N channel transistor connected between the second differential pair and a low-potential power supply, for producing the second bias current; and a control circuit for controlling the first current source such that the first current source produces a predetermined constant current and for controlling the first and second bias currents, the control circuit including:
  a third current source connected to the second current source, wherein the third current source includes a fourth N channel transistor that produces a current substantially equal to the second bias current; and
  a fifth N channel transistor connected to the fourth N channel transistor and a node between the first current source and the first differential pair, wherein the fifth N channel transistor is responsive to one of the first and second input voltages.

18. A semiconductor device includes an operational amplifier circuit, wherein the operational amplifier circuit comprises:

a first differential pair including a first P channel transistor responsive to a first input voltage and a second P channel transistor responsive to a second input voltage, the first differential pair receiving a first bias current;

a second differential pair including a first N channel transistor responsive to the first input voltage and a second N channel transistor responsive to the second input voltage, the second differential pair receiving a second bias current;

a first current source including a third P channel transistor connected between the first differential pair and a high-potential power supply;

a second current source, including a third N channel transistor connected between the second differential pair and a low-potential power supply, for producing the second bias current; and a control circuit for controlling the second current source such that the second current source produces a predetermined constant current and controlling the first and second bias currents, the control circuit including:
  a third current source connected to the first current source and including a fourth P channel transistor that produces a current substantially equal to the first bias current; and a fifth P channel transistor connected to the fourth P channel transistor and a node between the second current source and the second differential pair and responsive to one of the first and second input voltages.

19. An operational amplifier circuit comprising:

a first transistor the drain of which receives a first current;

a first resistor element connected between the gate and the source of the first transistor;

a second transistor, the gate of which is connected to the drain of the first transistor and the source of which is connected to the gate of the first transistor;

a differential pair including first and second differential transistors, the sources of which receive a second current originating from the drain current of the second transistor and the gates of which respectively receive first and second input signals;

second and third resistor elements respectively connected to the drains of the first and second differential transistors;

a third transistor, the gate of which is connected to a first node between a first terminal of the second resistor element and the drain of the first differential transistor, wherein the source of the third transistor is connected to a second terminal of the second resistor element, and a third current, which is related to the first current, is generated at the drain of the third transistor;

a first output transistor, the gate of which is connected to a second node between a third terminal of the third resistor element and the drain of the second differential transistor, wherein the source of the first output transistor is connected to a fourth terminal of the third resistor element, and a fourth current, which is related to the first current, is generated at the drain of the first output transistor;

a fourth resistor element connected to the drain of the third transistor; and a second output transistor, the gate of which is connected to a third node between the drain of the third transistor and the fourth resistor element, wherein the source of the second output transistor is connected to the fourth resistor element, and a fifth current, which corresponds to a gate voltage of the third transistor, is generated at the drain of the second output transistor based on the third current.

20. The operational amplifier circuit according to claim 19, wherein the resistances of the first to third resistor elements and the second current are set such that a gate voltage of the first transistor becomes substantially equal to gate voltages of the third transistor and the first output transistor.

21. The operational amplifier circuit according to claim 20, further comprising a current mirror circuit for producing the second current by mirroring the drain current of the second transistor.

22. The operational amplifier circuit according to claim 21, wherein the current mirror circuit includes a first current mirror transistor connected to the second transistor and a second current mirror transistor connected to the sources of the first and second differential transistors, and a ratio of the size of the first current mirror transistor to the size of the second current mirror transistor is equal to a ratio of the drain current of the second transistor to the total current flowing in the first and second differential transistors.

23. The operational amplifier circuit according to claim 19, further comprising:

a constant current source circuit which includes a fourth transistor and a fifth resistor element connected between the gate and the source of the fourth transistor, wherein the constant current source controls a gate voltage of the fourth transistor such that a sixth current flowing across the fifth resistor element coincides with a drain current of the fourth transistor, wherein the constant current source produces the first current, and the first current is substantially equal to the drain current of the fourth transistor, and wherein a ratio of the sixth current to the third current is set to a reciprocal of a ratio of the resistance of the fourth resistor element to the resistance of the fifth resistor element, and a gate voltage of the second output transistor is determined by the resistance of the fourth resistor element and the third current.

24. The operational amplifier circuit according to claim 23, wherein the size of the second output transistor is proportional to the size of the fourth transistor and a ratio of the fifth current to the sixth current coincides with a ratio of the size of the fourth transistor to the size of the second output transistor.

25. The operational amplifier circuit according to claim 23, wherein the constant current source circuit includes:

a fifth transistor, the source of which is connected to the fifth resistor element and the gate of which is connected to the drain of the fourth transistor; and a second current mirror circuit including a first current mirror transistor connected to the drain of the fourth transistor and a second current mirror transistor connected to the drain of the fifth transistor.

26. A semiconductor device including an operational amplifier circuit, wherein the operational amplifier circuit comprises:

a first transistor, the drain of which receives a first current;

a first resistor element connected between the gate and the source of the first transistor;

a second transistor, the gate of which is connected to the drain of the first transistor and the source of which is connected to the gate of the first transistor;

a differential pair including first and second differential transistors, the sources of which receive a second current originating from the drain current of the second transistor and the gates of which respectively receive first and second input signals;

second and third resistor elements respectively connected to the drains of the first and second differential transistors;

a third transistor, the gate of which is connected to a first node between a first terminal of the second resistor element and the drain of the first differential transistor, and the source of which is connected to a second terminal of the second resistor element, wherein a third current, which is related to the first current, is generated at the drain of the third transistor;

a first output transistor, the gate of which is connected to a second node between a third terminal of the third resistor element and the drain of the second differential transistor, and the source of which is connected to a fourth terminal of the third resistor element, wherein a fourth current, which is related to the first current, is generated at the drain of the first output transistor;

a fourth resistor element connected to the drain of the third transistor; and a second output transistor, the gate of which is connected to a third node between the drain of the third transistor and the fourth resistor element, and the source of which is connected to the fourth resistor element, wherein a fifth current, which corresponds to a gate voltage of the third transistor, is generated at the drain of second output transistor the based on the third current.

27. A method of controlling an operational amplifier circuit, wherein the operational amplifier circuit includes a first differential pair including a first transistor responsive to a first input voltage and a second transistor responsive to a second input voltage, a second differential pair including a third transistor responsive to the first input voltage and a fourth transistor responsive to the second input voltage, a fifth transistor connected to the first and third transistors, and a sixth transistor connected to the second and fourth transistors, the method comprising the steps of:

supplying a first bias current to the first differential pair using a first current source;

supplying a second bias current to the second differential pair using a second current source;

supplying a third bias current to the fifth transistor using a third current source;

supplying a fourth bias current to the sixth transistor using a fourth current source; and receiving the first and second input voltages to control the first to fourth current sources such that the sum of the first and second bias currents is constant and the second to fourth bias currents become substantially equal.

28. A method of controlling first and second bias currents respectively supplied to first and second differential pairs of an operational amplifier circuit, comprising:

controlling the second bias current in accordance with one of first and second input voltages; and generating a current substantially equal to the second bias current on the basis of one of first and second differential signals supplied to each of the first and second differential pairs; and controlling the first bias current using a predetermined current and the current substantially equal to the second bias current.

29. A method of controlling first and second bias currents respectively supplied to first and second differential pairs of an operational amplifier circuit, comprising:

controlling the second bias current in accordance with one of first and second input voltages; and generating a current substantially equal to the second bias current;

generating the first bias current by adding a predetermined constant current to the current; and supplying the second bias current to the second differential pair, directly.

\* \* \* \* \*